US010079702B2

(12) United States Patent
Chee et al.

(10) Patent No.: US 10,079,702 B2
(45) Date of Patent: Sep. 18, 2018

(54) FRONT-END MODULE AND COUPLING COMPENSATION FOR CLOSED-LOOP DIGITAL PRE-DISTORTION SYSTEM

(71) Applicant: MediaTek Inc., Hsinchu (TW)

(72) Inventors: YuenHui Chee, Redwood, CA (US); Fei Song, San Jose, CA (US); James Wang, Cupertino, CA (US); Toru Matsuura, Cupertino, CA (US); Osama K. A. Shana'a, Los Altos, CA (US); Chiyuan Lu, San Jose, CA (US)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/972,038

(22) Filed: Dec. 16, 2015

(65) Prior Publication Data

US 2016/0105299 A1  Apr. 14, 2016

Related U.S. Application Data

(60) Provisional application No. 62/188,893, filed on Jul. 6, 2015.

(51) Int. Cl.
*H04L 27/00* (2006.01)
*H03F 3/21* (2006.01)
(Continued)

(52) U.S. Cl.
CPC ....... *H04L 27/0002* (2013.01); *H03F 1/0205* (2013.01); *H03F 1/3241* (2013.01);
(Continued)

(58) Field of Classification Search
CPC ..... H04L 27/0002; H04L 25/08; H04L 1/243; H04L 27/366; H03F 2200/451; H03F 2200/294
See application file for complete search history.

(56) References Cited

U.S. PATENT DOCUMENTS 7,856,048 B1 * 12/2010 Smaini ............... H04B 1/40
330/2
8,265,567 B2 9/2012 Gorbachov
(Continued)

FOREIGN PATENT DOCUMENTS

WO WO 2014018379 A1 1/2014

OTHER PUBLICATIONS

Kwon et al., Digitally Equalized CMOS Transmitter Front-End With Integrated Power Amplifier, IEEE Journal of Solid-State Circuits, vol. 45, No. 8, Aug. 2010.
(Continued)

*Primary Examiner* — Aristocratis Fotakis
(74) *Attorney, Agent, or Firm* — Han IP Corporation; Andy M. Han

(57) ABSTRACT

Examples of front-end modules, apparatuses and methods for coupling compensation in a closed-loop digital pre-distortion (DPD) system are described. The closed-loop DPD circuit may include a PA and a loopback path. The PA may receive a PA input signal and amplify the PA input signal to provide a PA output signal proportional to a product of the PA input signal and a gain of the PA. The loopback path may receive the PA output signal to output a loopback signal. A forward coupling and a backward coupling may exist between the PA input signal and an output of the loopback path. The output of the loopback path may be proportional to a product of the PA output signal and a gain of the loopback path. The loopback path may include a coupling cancellation mechanism configured to cancel couplings between the PA input signal and the loopback signal.

23 Claims, 17 Drawing Sheets

(51) Int. Cl.
*H03F 1/02* (2006.01)
*H03F 3/19* (2006.01)
*H04L 25/08* (2006.01)
*H04B 1/40* (2015.01)
*H03F 3/24* (2006.01)
*H04L 27/36* (2006.01)
*H04B 1/04* (2006.01)
*H03F 1/32* (2006.01)
*H03F 3/189* (2006.01)
*H03F 3/20* (2006.01)

(52) U.S. Cl.
CPC ............. *H03F 1/3247* (2013.01); *H03F 3/19* (2013.01); *H03F 3/245* (2013.01); *H04B 1/0475* (2013.01); *H04B 1/40* (2013.01); *H04L 25/08* (2013.01); *H04L 27/36* (2013.01); *H04L 27/368* (2013.01); *H03F 3/189* (2013.01); *H03F 3/20* (2013.01); *H03F 2200/294* (2013.01); *H03F 2200/451* (2013.01); *H03F 2201/3236* (2013.01); *H04B 2001/0425* (2013.01)

(56) References Cited

U.S. PATENT DOCUMENTS

| | | | |
|---|---|---|---|
| 8,295,845 B1* | 10/2012 | Abdollahi-Alibeik | H04B 17/14 455/226.1 |
| 8,417,286 B2 | 4/2013 | Gorbachov et al. | |
| 8,699,620 B1* | 4/2014 | Wu | H04N 7/52 375/254 |
| 9,667,282 B1* | 5/2017 | Merlin | H04B 1/0475 |
| 2003/0102914 A1* | 6/2003 | Kenington | H03F 1/3247 330/149 |
| 2004/0106380 A1 | 6/2004 | Vassiliou et al. | |
| 2005/0148304 A1* | 7/2005 | Jerng | H04B 1/30 455/75 |
| 2005/0156780 A1* | 7/2005 | Bonthron | G01S 13/343 342/107 |
| 2007/0189371 A1* | 8/2007 | Yen | H04L 27/364 375/219 |
| 2009/0316826 A1* | 12/2009 | Koren | H04L 27/366 375/296 |
| 2010/0239047 A1* | 9/2010 | Takayashiki | H03F 1/3247 375/296 |
| 2010/0311353 A1* | 12/2010 | Teillet | H01Q 1/246 455/84 |
| 2011/0075715 A1* | 3/2011 | Kravitz | H04B 1/30 375/221 |
| 2011/0150038 A1* | 6/2011 | Korol | H03F 1/3211 375/130 |
| 2012/0170622 A1* | 7/2012 | Ly-Gagnon | H04L 27/364 375/219 |
| 2012/0263215 A1* | 10/2012 | Peng | H04B 1/0475 375/221 |
| 2012/0263256 A1* | 10/2012 | Waheed | H04B 1/0475 375/296 |
| 2012/0264378 A1* | 10/2012 | Steele | H04B 17/13 455/73 |
| 2014/0161005 A1* | 6/2014 | Laurent-Michel | H04B 1/525 370/281 |
| 2014/0194071 A1* | 7/2014 | Wyville | H04B 1/525 455/73 |
| 2015/0028946 A1* | 1/2015 | Al-Qaq | H03F 1/3241 330/149 |

OTHER PUBLICATIONS

Lakdawala et al., A 32 nm SoC With Dual Core ATOM Processor and RF WiFi Transceiver, IEEE Journal of Solid-State Circuits, vol. 48, No. 1, Jan. 2013.
Karki; J., Fully-Differential Amplifiers, Application Report, SLOA054D, Texas Instruments, Jan. 2002.
European Patent Office, European Search Report regarding EP1151877, dated Oct. 11, 2016.

* cited by examiner

FRONT-END MODULE AND COUPLING COMPENSATION FOR CLOSED-LOOP DIGITAL PRE-DISTORTION SYSTEM

CROSS REFERENCE TO RELATED PATENT APPLICATION

The present disclosure claims the priority benefit of U.S. Provisional Patent Application Ser. No. 62/188,893, filed on 6 Jul. 2015, which is incorporated by reference in its entirety.

TECHNICAL FIELD

The present disclosure is generally related to radio frequency (RF) circuitry and, more particularly, to front-end modules, apparatuses and methods utilizing coupling compensation for a closed-loop digital pre-distortion system.

BACKGROUND

Digital pre-distortion (DPD) technique is widely used in power amplifier (PA) design to improve the performance and efficiency of the PA in electronic apparatuses such as, for example, wireless communication apparatuses. To provide a robust DPD solution over process, temperature and voltage variations, closed-loop DPD system is often employed. In a closed-loop DPD system 1600 as shown in FIG. 16, an RF loopback path (RFLB) is used to replicate signal distortion in the PA output signal, which is fed into a DPD calibration engine. The DPD calibration engine then processes this distortion to generate a pre-distorted signal. This DPD compensation is fed back to the PA to compensate for signal distortion during normal operation. To compensate the PA accurately, it is essential that the RFLB path replicates signal distortion in the PA with high fidelity.

In actual implementation of such closed-loop system, however, there are often unwanted couplings to the RFLB path, thus resulting in degradation in the fidelity of the RFLB signal. The unwanted couplings can arise from, for example, supply network, non-intended signal paths, substrate coupling, on-chip magnetic coupling, bond wire coupling, package coupling and printed circuit board (PCB) coupling. To illustrate the issue due to unwanted couplings, consider a generalized case 1700 shown in FIG. 17 where there is a forward coupling and a backward coupling between the PA input and the RFLB signal with transfer function $A_1 e^{j\Theta_1}$ and $A_2 e^{j\Theta_2}$, respectively. As shown in FIG. 17, the transfer function of the PA is $G_{PA}$ and the transfer function of the RFLB path is $G_{RFLB}$.

During normal operation, the RFLB path is off and the PA transfer function can be expressed as Equation (1) below, where $V_{in}$ represents an input signal of the PA and $V_{PA}$ represents an output signal of the PA:

$$\frac{v_{PA}}{v_{in}} = G_{PA} \quad (1)$$

During RFLB, the RFLB path is on and RFLB signal can be expressed as Equation (2) below, where $V_{rflb}$ represents an output signal of the RFLB path:

$$\frac{v_{rflb}}{v_{in}} = \frac{G_{PA} G_{RFLB} + A_1 e^{j\theta_1}}{1 - A_2 e^{j\theta_2} G_{PA} G_{RFLB}} \quad (2)$$

Accordingly, the RFLB signal does not replicate the PA signal faithfully as a result of unwanted couplings. Undesirably, the distortion of the PA cannot be compensated accurately by the DPD calibration engine of the closed-loop DPD system.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to provide schemes, techniques, front-end modules, apparatuses and methods for coupling compensation in a closed-loop digital pre-distortion system. Advantageously, implementations of the present disclosure reduce or remove unwanted couplings in a radio frequency (RF) loopback signal by introducing a non-zero phase shifting element in a closed-loop DPD circuit. Moreover, the RF loopback path with coupling compensation may be employed in a front-end module which interfaces an antenna and a transceiver in a communication apparatus. Advantageously, the RF sensing capability of the RF loopback path improves PA efficiency and linearity in the FEM.

In one aspect, a closed-loop DPD circuit may include a PA, a loopback path and a phase shifting element. The PA may be configured to receive a PA input signal and amplify the PA input signal to provide a PA output signal which is proportional to a product of the PA input signal and a gain of the PA. The loopback path may be coupled to receive the PA output signal. A forward coupling and a backward coupling may exist between the PA input signal and an output of the loopback path. Moreover, the forward coupling and the backward coupling may also exist between internal nodes of the PA and internal nodes of the RF loopback path. The output of the loopback path may be proportional to a product of the PA output signal and a gain of the loopback path. The phase shifting element may be configured to shift a phase of either the PA input signal or the PA output signal to cause the loopback path to output a first loopback signal and a second loopback signal with a non-zero phase shift from the first loopback signal such that a difference between the first loopback signal and the second loopback signal is at least approximately linearly proportional to a product of the gain of the PA and a gain of the loopback path.

In another aspect, a method may involve phase shifting a phase of either a PA input signal received by a PA of a closed-loop DPD circuit or a PA output signal outputted by the PA to cause a loopback path of the closed-loop DPD circuit to output a first loopback signal and a second loopback signal with a non-zero phase shift from the first loopback signal. The method may also involve processing the first loopback signal and the second loopback signal to replicate the PA output signal. The PA may be configured to receive the PA input signal and amplify the PA input signal to provide the PA output signal which is proportional to a product of the PA input signal and a gain of the PA. The loopback path may be coupled to receive the PA output signal to provide an output which is proportional to a product of the PA output signal and a gain of the loopback path. A forward coupling and a backward coupling may exist between the PA input signal and the output of the loopback path. Moreover, the forward coupling and the backward coupling may also exist between internal nodes of the PA and internal nodes of the RF loopback path.

In yet another aspect, an apparatus may include an antenna, a transceiver configured to generate an outgoing signal and receive an incoming signal, a front-end module (FEM) coupled between the antenna and the transceiver, and a loopback circuit. The FEM may include a combining element, a PA, and a low-noise amplifier (LNA). The combining element, which may be a transmit/receive (T/R) switch for example, may be coupled to the antenna to transmit and receive signals through the antenna. The PA may be configured to receive the outgoing signal from the transceiver as a PA input signal and amplify the PA input signal to provide a PA output signal to the antenna through the combining element. The LNA may be configured to receive a pre-amplified incoming signal from the antenna through the combining element, the LNA further configured to amplify the pre-amplified incoming signal to provide the incoming signal to the transceiver. The loopback circuit may be configured to sense the PA output signal and generate a loopback signal corresponding to characteristics of the PA output signal. The loopback signal may be received by the transceiver.

In still another aspect, an apparatus may include an antenna, a transceiver configured to generate an outgoing signal and receive an incoming signal, a PA, a LNA, and a loopback path. The PA may be configured to receive the outgoing signal from the transceiver as a PA input signal and amplify the PA input signal to provide a PA output signal to the antenna. The LNA may be configured to receive a pre-amplified incoming signal from the antenna and amplify the pre-amplified incoming signal to provide the incoming signal to the transceiver. The loopback path may be coupled in parallel with the LNA, and may be configured to sense the PA output signal and generate a loopback signal corresponding to characteristics of the PA output signal. The loopback path may be further configured to operate at a first frequency different from a second frequency of the outgoing signal. The loopback signal may be received by the transceiver.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED IMPLEMENTATIONS

Overview

Figure 1:
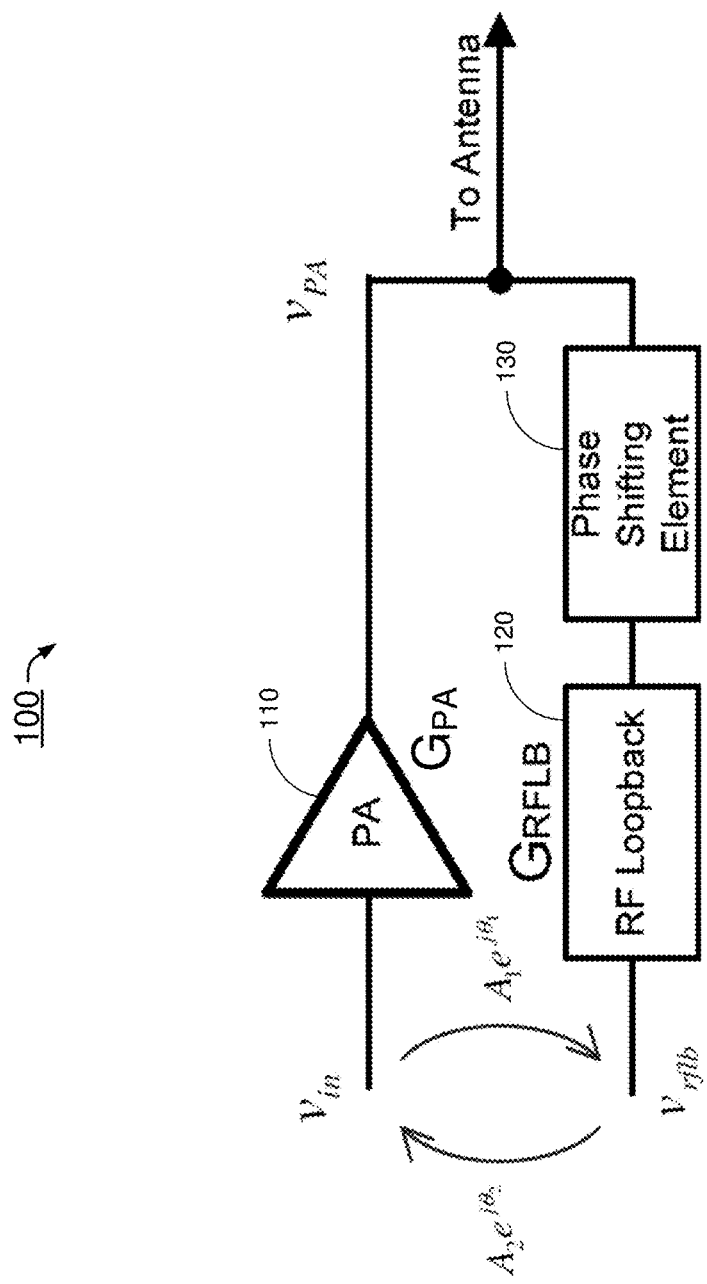
FIG. 1 is a block diagram of a portion of an example closed-loop DPD system in accordance with an implementation of the present disclosure.
Figure 2:
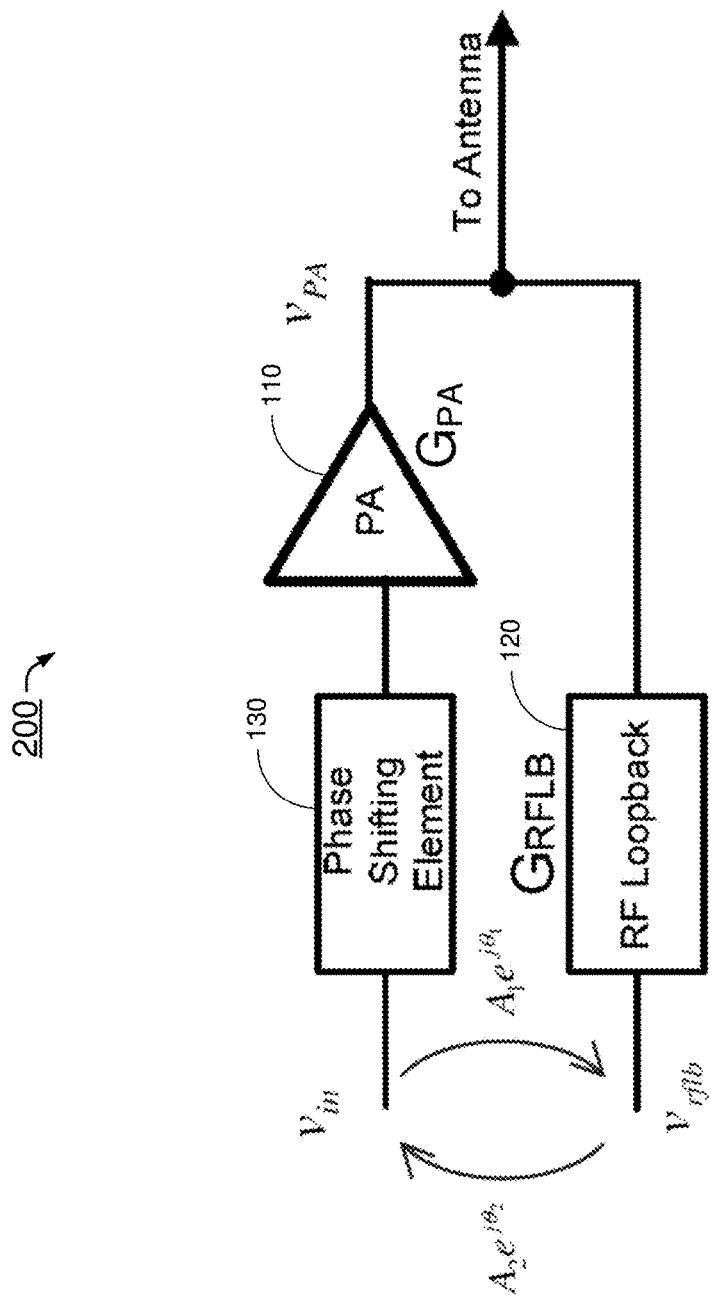
FIG. 2 is a block diagram of a portion of an example closed-loop DPD system in accordance with another implementation of the present disclosure.

FIG. 1 illustrates an example circuit 100 of an example closed-loop DPD system in accordance with an implementation of the present disclosure. FIG. 2 illustrates an example circuit 200 of an example closed-loop DPD system in accordance with another implementation of the present disclosure. As shown in FIG. 1, circuit 100 may include a power amplifier (PA) 110, a radio frequency loopback (RFLB) path 120 and a phase shifting element 130, with phase shifting element 130 disposed between an output of PA 110 and an input of RFLB path 120. As shown in FIG. 2, circuit 200 may include PA 110, RFLB path 120 and phase shifting element 130, with phase shifting element 130 disposed at an input of PA 110.

In each of circuit 100 and circuit 200, PA 110 may receive an input, $V_{in}$, and provide an output, $V_{PA}$, which may be provided to an antenna for transmission. The RFLB path 120, taking $V_{PA}$ as an input, may provide an output $V_{rflb}$. In each of circuit 100 and circuit 200, effects of unwanted couplings (e.g., forward coupling $A_1 e^{j\Theta_1}$ and backward coupling $A_2 e^{j\Theta_2}$) in a loopback signal outputted by RFLB path 120 may be removed by introducing non-zero phase shifting with phase shifting element 130. In some other implementations (not shown), multiple phase shifting elements 130 may be employed, such as having one phase shifting element 130 at the input of PA 110 and another phase shifting element 130 between the output of PA 110 and the input of RFLB path 120. Whether there is one or more than one phase shifting element 130 in the circuit, each phase shifting element 130 may be utilized to cause RFLB path 120 to generate loopback signals with different phase shifts and these phase-shifted loopback signals may be processed to reduce unwanted couplings that couple to a node after the phase shifting element 130.

To aid better appreciation of the technique proposed herein, consider an example scenario, implemented in circuit 100, in which phase shifting element 130 causes RFLB path 120 to generate a first loopback signal and a second loopback signal which has a non-zero phase shift from first loopback signal by 180°. A result from subtracting first and second loopback signals may be expressed as Equation (3) as follows:

$$\frac{v_{rflb,PA}}{v_{in}} = \frac{G_{PA}G_{RFLB} + A_1 e^{j\theta_1}}{1 - A_2 e^{j\theta_2} G_{PA} G_{RFLB}} - \frac{-G_{PA}G_{RFLB} + A_1 e^{j\theta_1}}{1 + A_2 e^{j\theta_2} G_{PA} G_{RFLB}} \approx 2 G_{PA} G_{RFLB} \quad (3)$$

The result of Equation (3), $$\frac{v_{rflb,PA}}{v_{in}},$$

is a replica of the PA output signal given that $A_1 A_2 G_{PA} G_{RFLB} \ll 1$ and $A_2^2 G_{PA} G_{RFLB} \ll 1$.

Using the proposed technique, the coupling effects may also be determined from the output of RFLB path 120 without coupling given in Equation (3) and the output of RFLB path 120 with coupling given in Equation (1). The difference between one half of the result of Equation (3) from the result of Equation (1) may be expressed as Equation (4) as follows:

$$\frac{v_{rflb,coupling}}{v_{in}} = \qquad (4)$$

$$\frac{G_{PA}G_{RFLB} + A_1 e^{j\theta_1}}{1 - A_2 e^{j\theta_2} G_{PA} G_{RFLB}} - G_{PA}G_{RFLB} \approx \frac{A_1 e^{j\theta_1}}{1 - A_2 e^{j\theta_2} G_{PA} G_{RFLB}}$$

The result of Equation (4), $$\frac{v_{rflb,coupling}}{v_{in}},$$

is the coupling effects given that $A_2 G_{PA}^2 G_{RFLB}^2 \ll 1$.

The coupling effects may then be removed in a digital DPD engine of the closed-loop DPD system before the DPD is applied. Advantageously, the proposed technique may enable real-time closed-loop DPD when the transmitted signal is used for DPD calibration. Also advantageously, the proposed technique may also enable adaptive closed-loop DPD.

Figure 3:
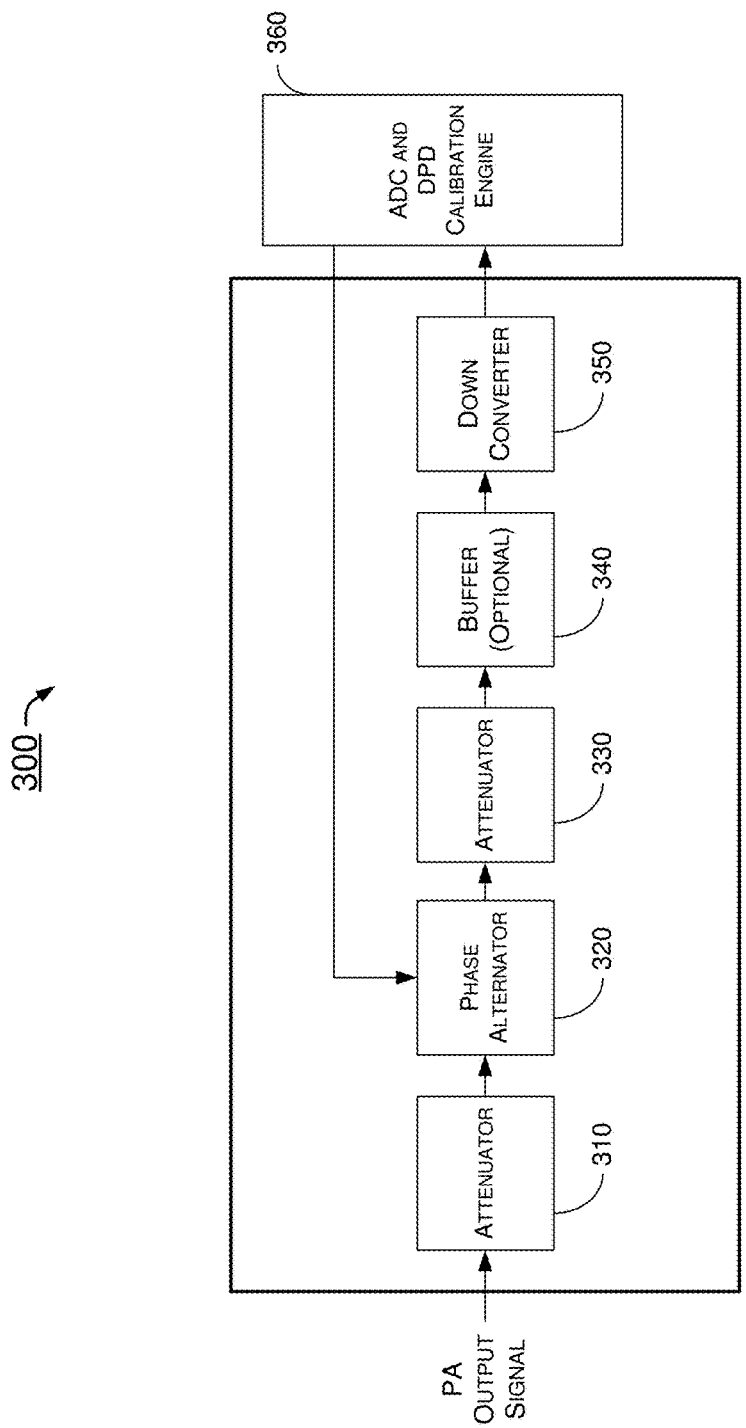
FIG. 3 is a block diagram of an example radio frequency loopback (RFLB) path in accordance with an implementation of the present disclosure.

FIG. 3 illustrates an example RFLB path 300 in accordance with an implementation of the present disclosure. RFLB path 300 may be an example implementation of RFLB path 120 in circuit 100 and/or circuit 200. In the example shown in FIG. 3, RFLB path 300 includes a first attenuator 310, a phase alternator 320, a second attenuator 330, a buffer 340 and a down converter 350. First attenuator 310 may be configured to receive and attenuate a PA output signal (e.g., from PA 110) to output a first attenuated signal. That is, first attenuator 310 may reduce the high-swing PA output signal to a more reasonable range. Phase alternator 320 may be configured to function as phase shifting element 130, and may be coupled to receive the first attenuated signal. Phase alternator 320 may be configured to shift a phase of the first attenuated signal to output a phase alternator output signal. That is, phase alternator 320 may produce two RFLB signals with 180° phase difference therebetween. Second attenuator 330 may be configured to receive and attenuate the phase alternator output signal to output a second attenuated signal. That is, second attenuator 330 may further reduce the RFLB signals to a more reasonable range for the rest of the circuit in RFLB path 300. Down converter 350 may be configured to receive and down convert the second attenuated signal from a first frequency to a second frequency lower than the first frequency. Buffer 340 may be coupled between second attenuator 330 and down converter 350. Buffer 340 may be configured to drive down converter 350, which may be a different integrated circuit (IC).

It is noteworthy that although two attenuators, namely first attenuator 310 and second attenuator 330, are shown in RFLB path 300, in various implementations RFLB path 300 may include either but not both of first attenuator 310 and second attenuator 330. In the case where a breakdown of devices in phase alternator 320 limits signal swing, having phase alternator 320 disposed between first attenuator 310 and second attenuator 330 may help to maximize a signal-to-coupling ratio before phase alternator 320 without damaging the circuits. The output of down converter 350 may be provided to an analog-to-digital converter (ADC) and DPD calibration engine 360, which may be external to and not a part of RFLB path 300. ADC and DPD calibration engine 360 may sample and process a down-converted RF loopback signal outputted by RFLB path 300, and provide a feedback or control signal to phase alternator 320 to shift the phase of the first attenuated signal to output the phase alternator output signal. ADC and DPD calibration engine 360 may be configured to perform computation using Equation (3) and Equation (4) described above to replicate the PA output signal and to determine coupling effects caused by forward coupling and backward coupling.

Figure 4:
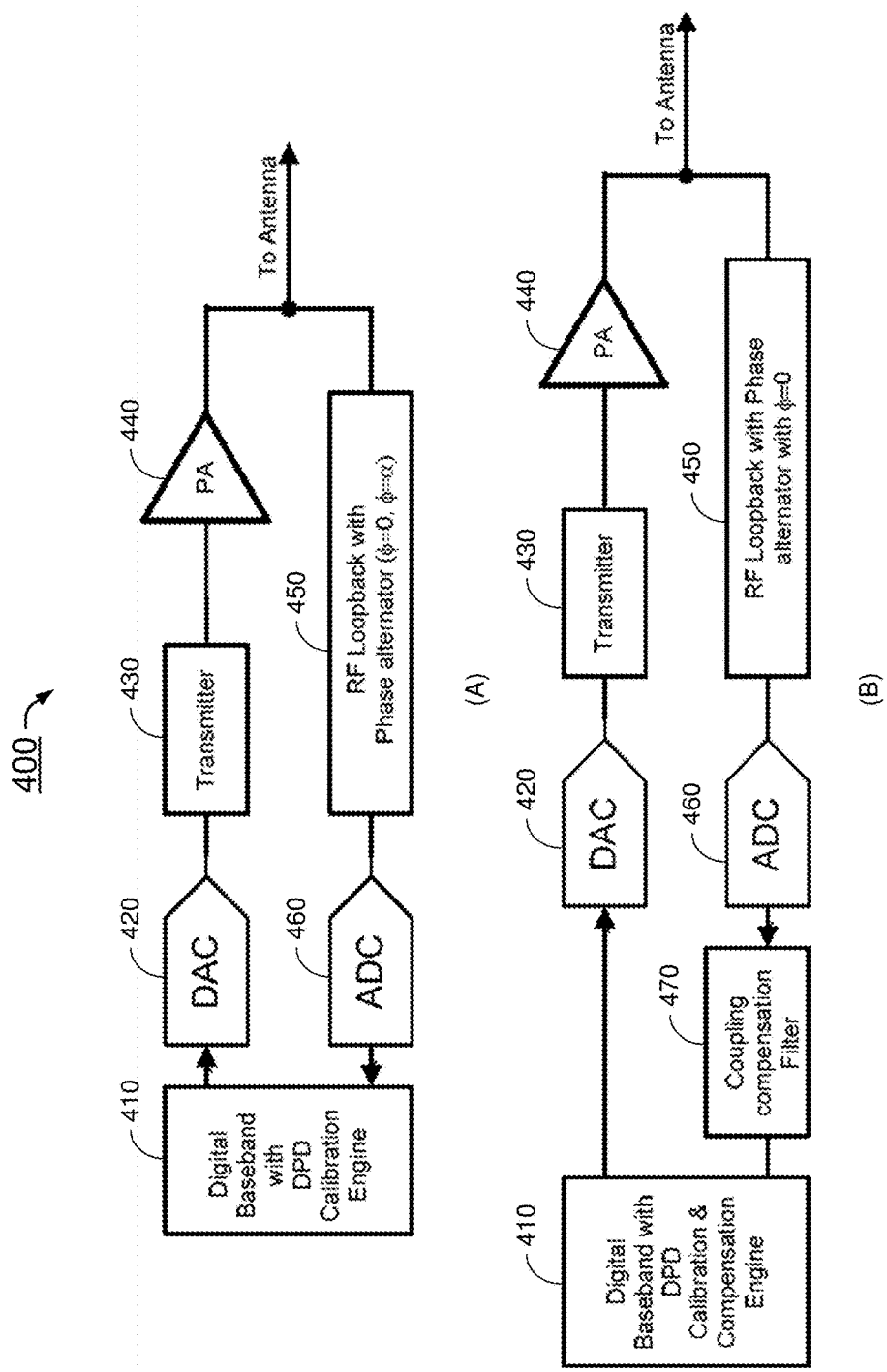
FIG. 4 is a block diagram of an example closed-loop DPD circuit during calibration and during normal operation in accordance with an implementation of the present disclosure.

FIG. 4 illustrates an example closed-loop DPD circuit 400 during calibration and during normal operation in accordance with an implementation of the present disclosure. In particular, part (A) of FIG. 4 shows closed-loop DPD circuit 400 during calibration, and part (B) of FIG. 4 shows closed-loop DPD circuit 400 during normal operation.

In the example shown in FIG. 4, closed-loop DPD circuit 400 includes a digital baseband with DPD calibration engine 410 (herein referred to as DPD calibration engine 410), a digital-to-analog converter (DAC) 420, a transmitter 430, a PA 440, a RFLB 450 and an analog-to-digital converter (ADC) 460. DPD calibration engine 410 may be configured to output a pre-distorted signal. DAC 420 may receive the pre-distorted signal from DPD calibration engine 410 and convert the pre-distorted signal from digital format to analog format to output an analog signal. Transmitter 430 may receive the analog signal and output a PA input signal based on the analog signal. PA 440 may be an example implementation of PA 110, and may receive the PA input signal for amplification and output a PA output signal, which may be provided to an antenna for wireless transmission. RFLB path 450 may be an example implementation of RFLB path 120 and RFLB path 300 with a phase alternator therein. ADC 460 may receive and convert an output of RFLB path 450 from analog format to digital format to output a digital signal. DPD calibration engine 410 may receive the digital signal and generate the pre-distorted signal based at least in part on the digital signal.

Referring to part (A) of FIG. 4, during calibration, closed-loop DPD circuit 400 may generate two RFLB signals that differ by a non-zero phase shift from each other (e.g., first loopback signal and second loopback signal with first loopback signal having a phase ϕ=0 and second loopback signal having a phase ϕ=α). These two loopback signals may be processed to determine the replica of the PA output signal as well as the unwanted coupling.

Referring to part (B) of FIG. 4, during normal operation, the phase alternator in the RFLB path 450 may be set to ϕ=0. This results in a PA response which may be expressed as Equation (5) as follows:

$$\frac{v_{PA}}{v_{in}} = \frac{G_{PA}}{1 - A_2 e^{j\theta_2} G_{PA} G_{RFLB}} \approx G_{PA} \text{ when } A_2 G_{PA} G_{RFLB} << 1 \quad (5)$$

To replicate the PA output signal with phase shifting by the phase alternator of RFLB path 450 set to ϕ=0, a coupling compensation filter 470 may be added to closed-loop DPD circuit 400 between ADC 460 and DPD calibration engine 410, as shown in part (B) of FIG. 4. Coefficients of coupling compensation filter 470 may be determined during the calibration of closed-loop DPD circuit 400 in a calibration mode thereof. This will maintain the fidelity of the RFLB signal which is used to generate the PA pre-distorted signal by DPD calibration engine 410.

Closed-loop DPD circuit 400 may also support adaptive and real-time DPD. For adaptive DPD, RFLB path 450 may be enabled and DPD calibration may be applied when needed. For real-time DPD, RFLB path 450 may be enabled and DPD calibration may be applied all the time. In real time DPD, the signal used for DPD calibration may be derived from the transmitted signal, e.g., the PA output signal outputted by PA 440.

Example Implementations

Figure 5:
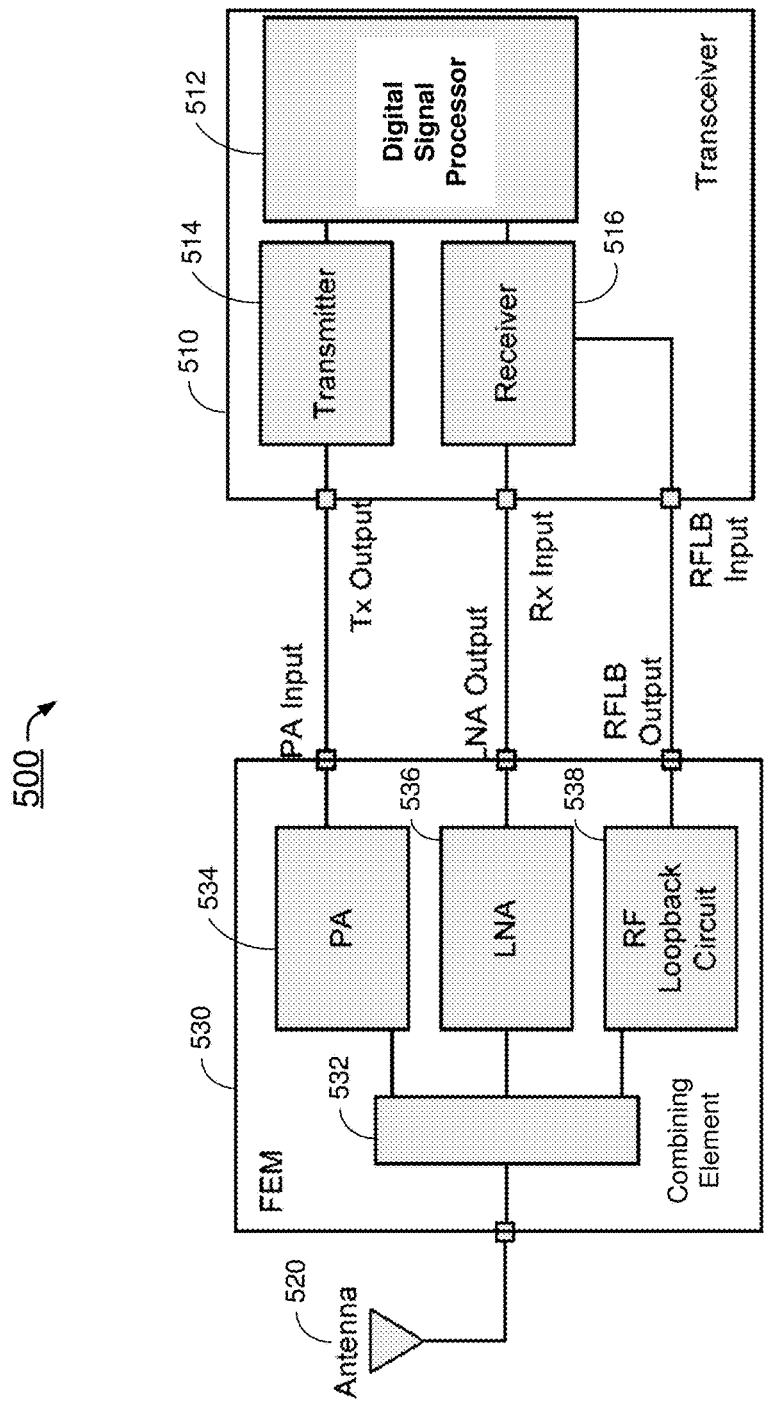
FIG. 5 is a block diagram of an example apparatus having a FEM with an internal loopback circuit in accordance with an implementation of the present disclosure.
Figure 6:
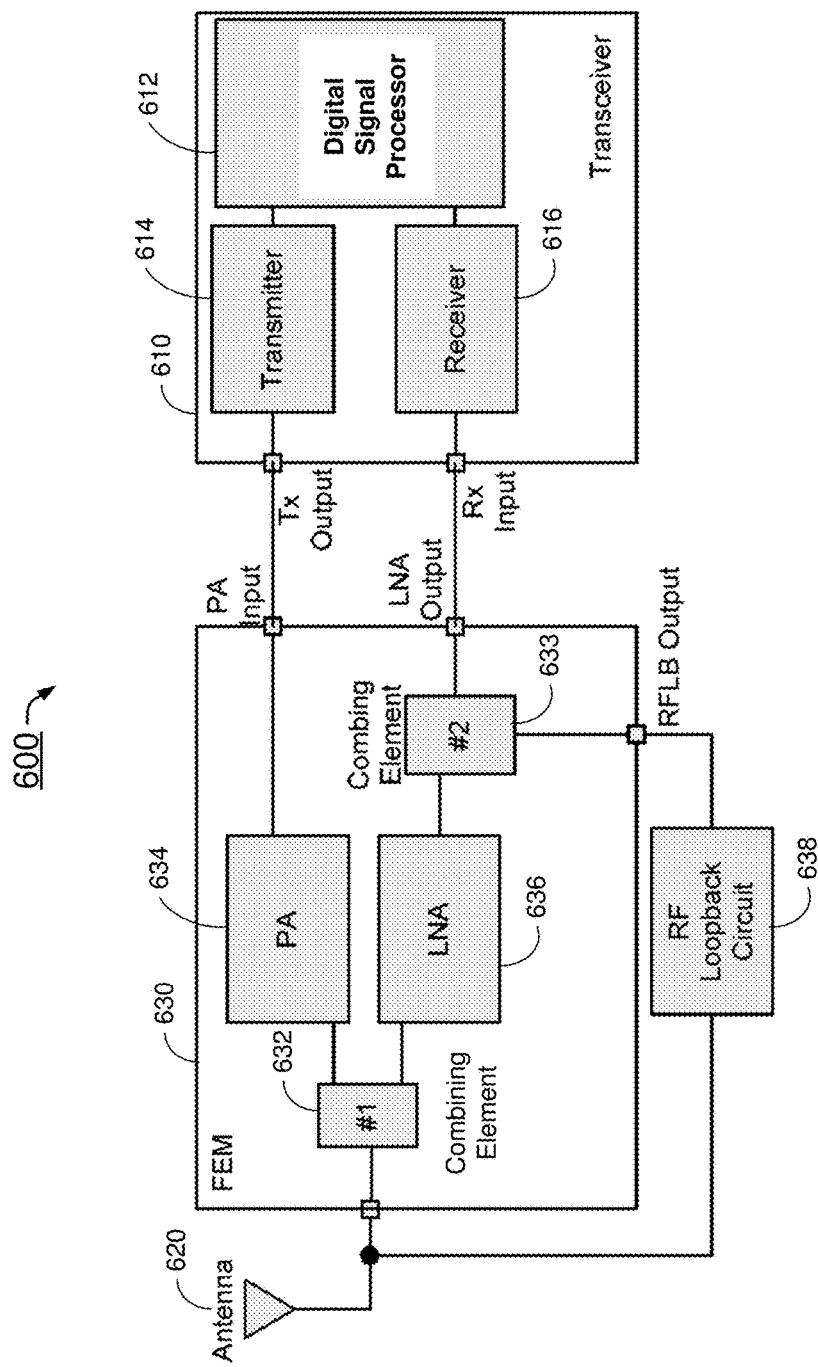
FIG. 6 is a block diagram of an example apparatus having a FEM with an external loopback circuit in accordance with an implementation of the present disclosure.
Figure 7:
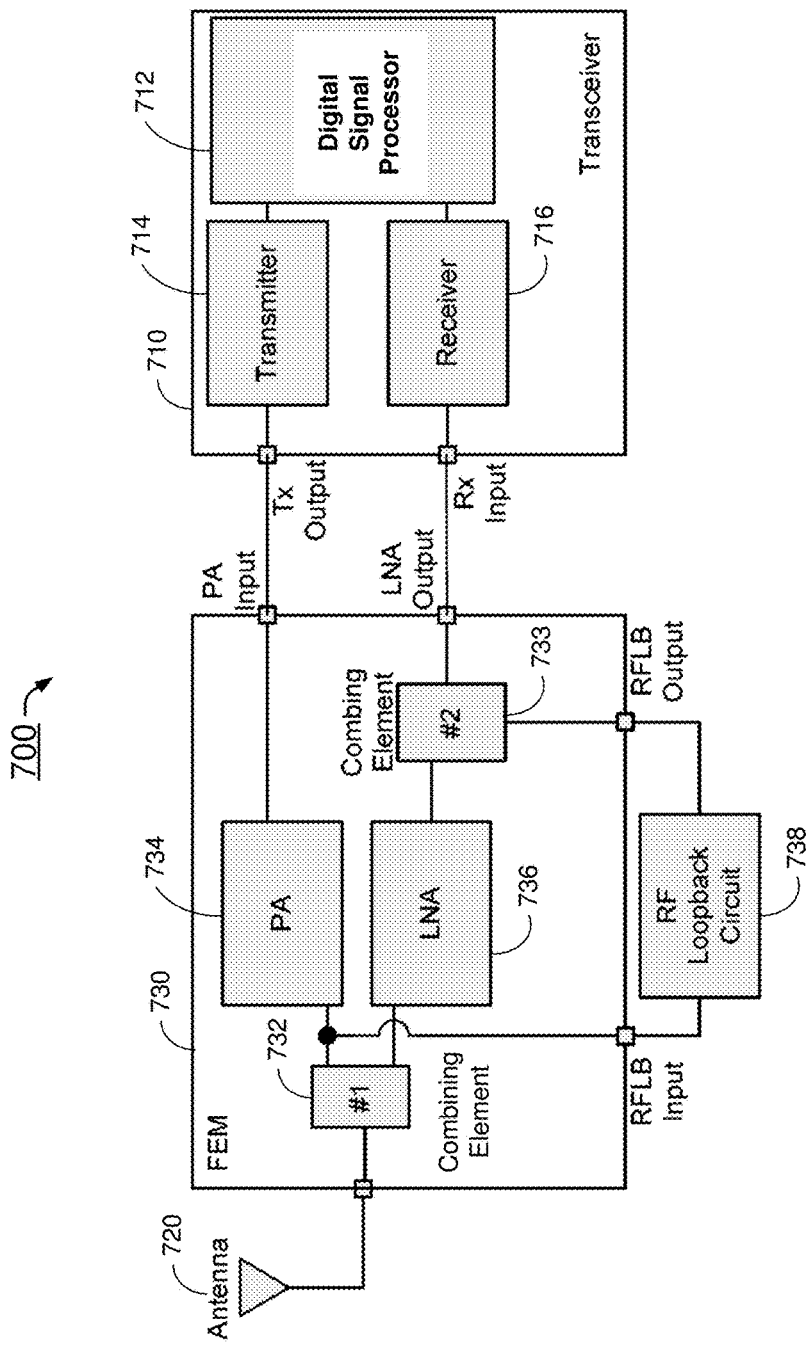
FIG. 7 is a block diagram of an example apparatus having a FEM with an external loopback circuit in accordance with another implementation of the present disclosure.
Figure 8:
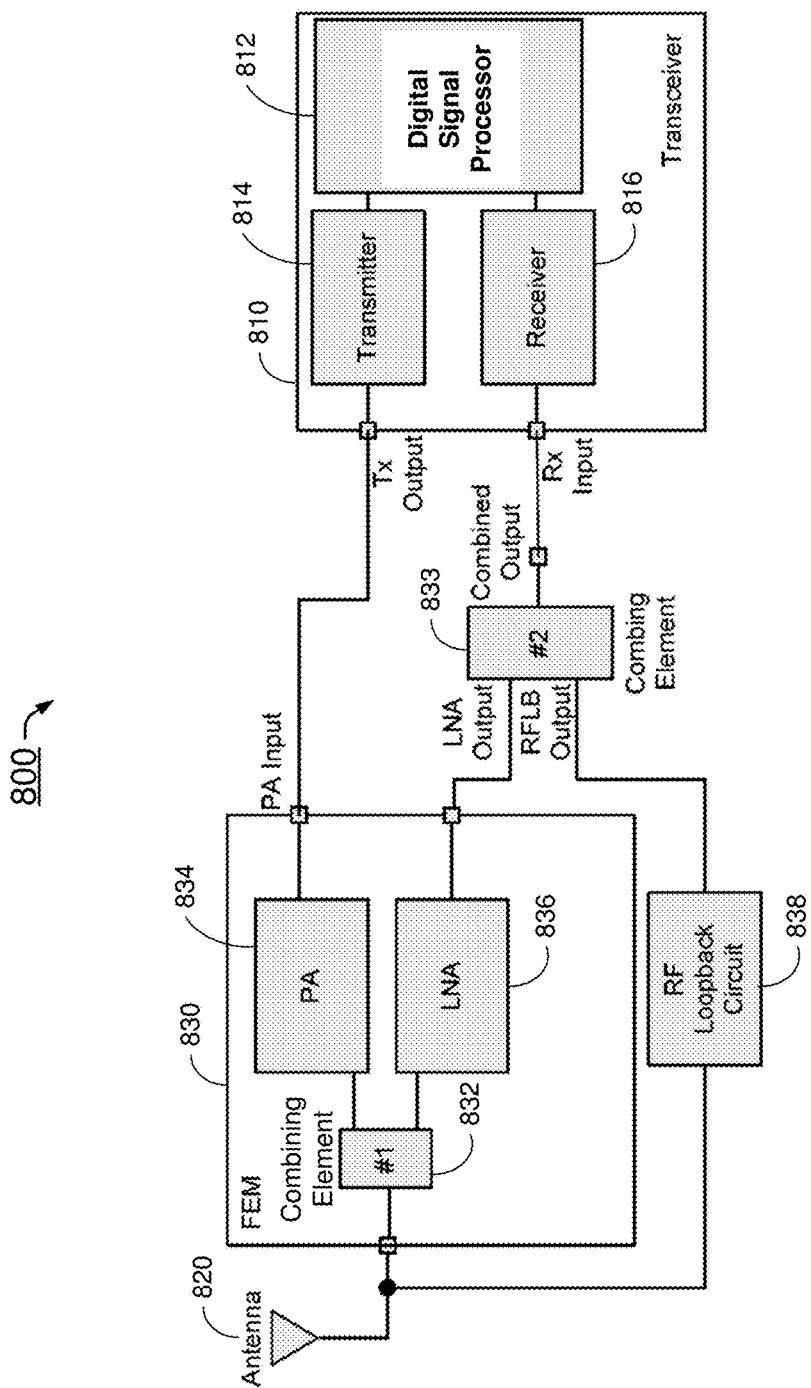
FIG. 8 is a block diagram of an example apparatus having a FEM with an external loopback circuit in accordance with yet another implementation of the present disclosure.
Figure 9:
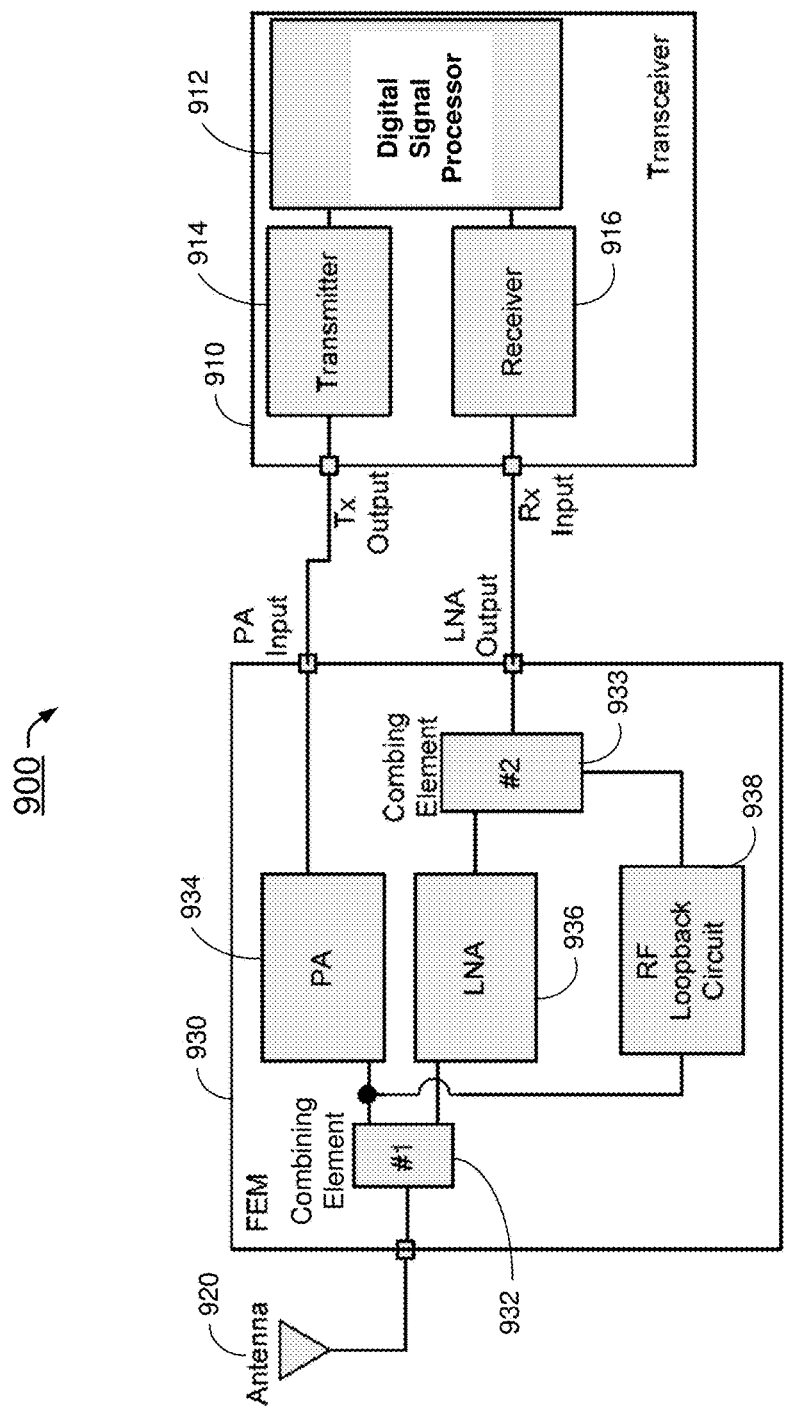
FIG. 9 is a block diagram of an example apparatus having a FEM with an internal loopback circuit in accordance with another implementation of the present disclosure.
Figure 10:
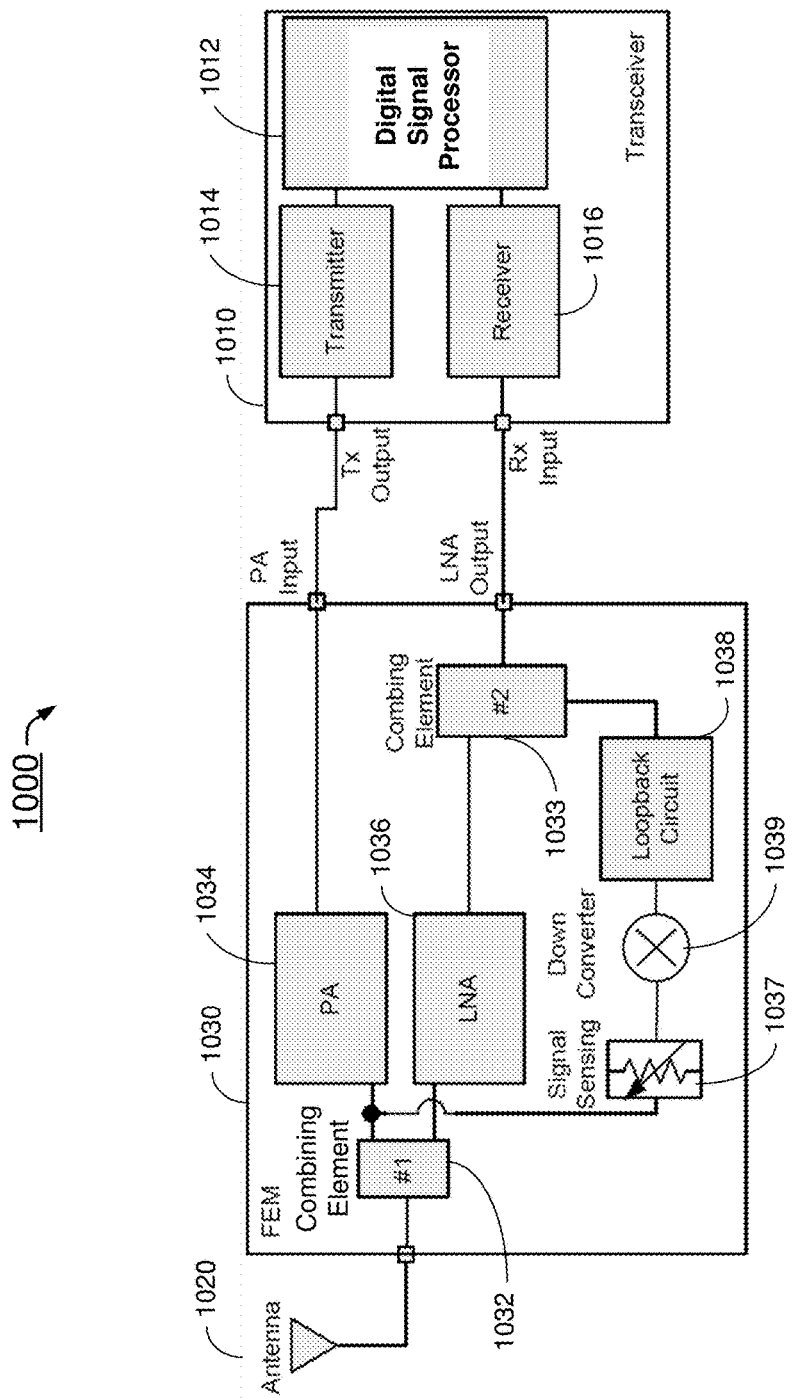
FIG. 10 is a block diagram of an example apparatus having a FEM with an internal loopback circuit in accordance with yet another implementation of the present disclosure.
Figure 11:
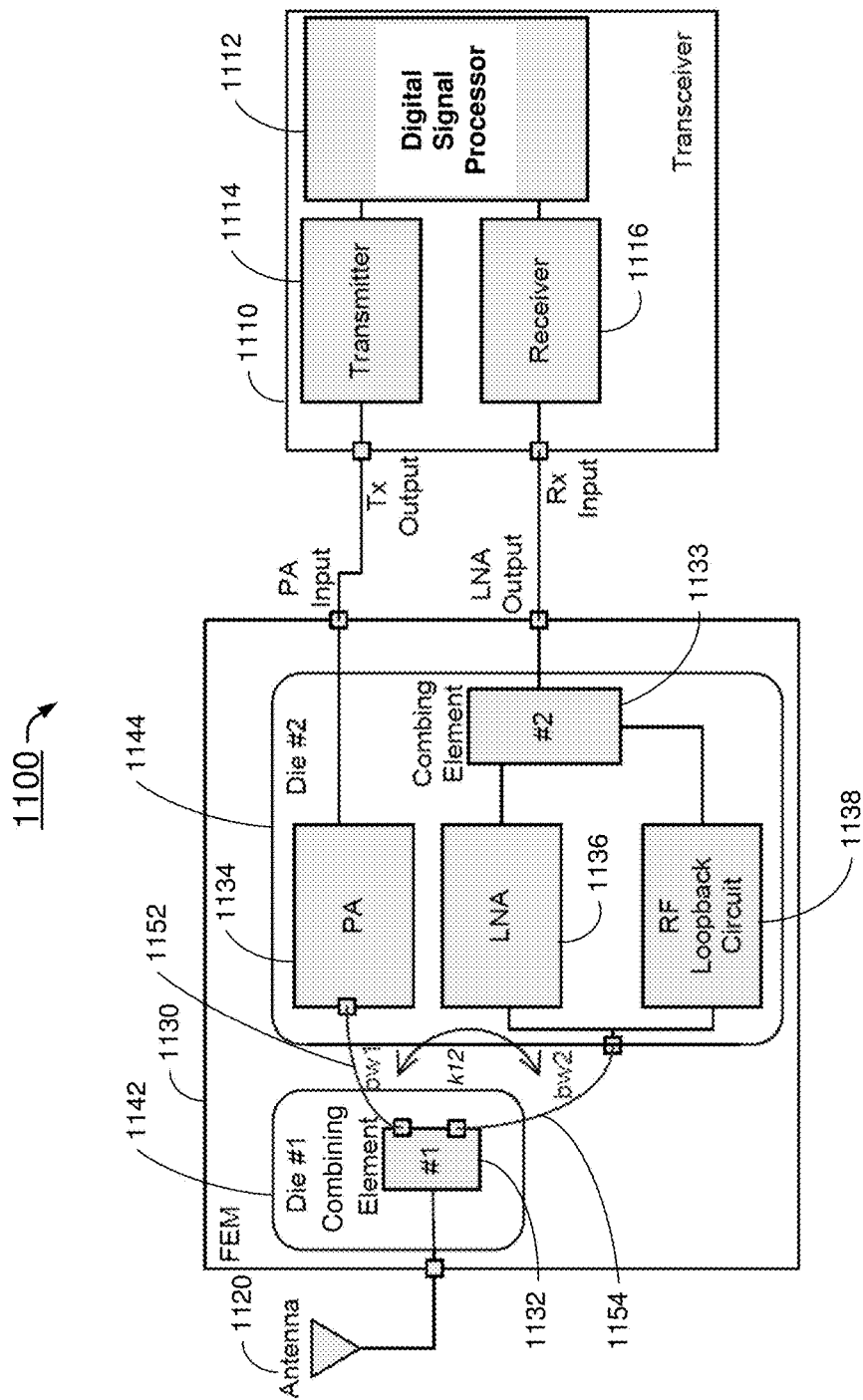
FIG. 11 is a block diagram of an example apparatus having a two-die FEM with an internal loopback circuit in accordance with an implementation of the present disclosure.
Figure 12:
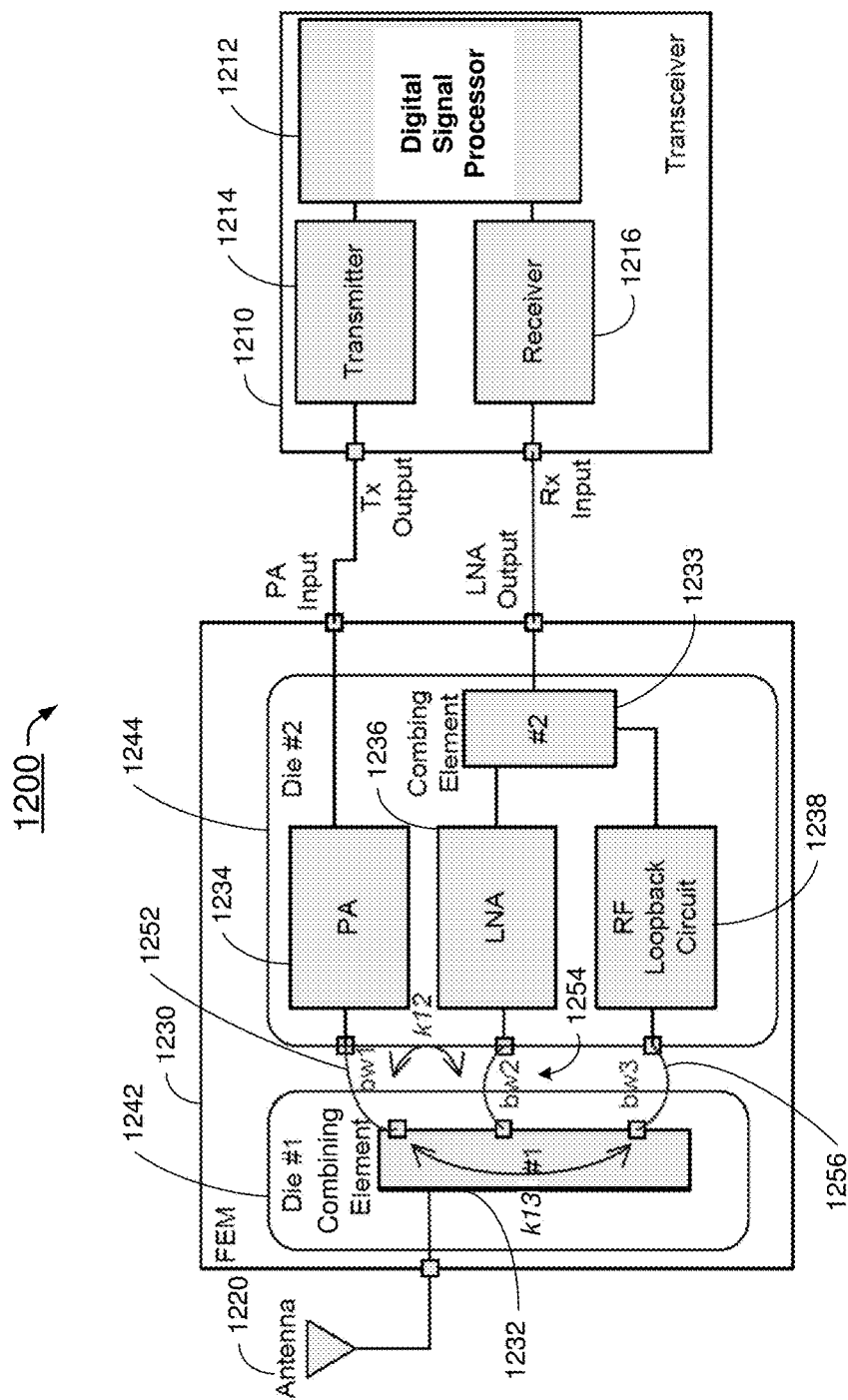
FIG. 12 is a block diagram of an example apparatus having a two-die FEM with an internal loopback circuit in accordance with another implementation of the present disclosure.

Each of FIG. 5-FIG. 12 illustrates an example apparatus having a front-end module (FEM) in accordance with an implementation of the present disclosure. Specifically, FIG. 5 illustrates an example apparatus 500 having a FEM with an internal loopback circuit; FIG. 6 illustrates an example apparatus 600 having a FEM with an external loopback circuit; FIG. 7 illustrates an example apparatus 700 having a FEM with an external loopback circuit; FIG. 8 illustrates an example apparatus 800 having a FEM with an external loopback circuit; FIG. 9 illustrates an example apparatus 900 having a FEM with an internal loopback circuit; FIG. 10 illustrates an example apparatus 1000 having a FEM with an internal loopback circuit; FIG. 11 illustrates an example apparatus 1100 having a two-die FEM with an internal loopback circuit; and FIG. 12 illustrates an example apparatus 1200 having a two-die FEM with an internal loopback circuit. The example apparatus illustrated in each of FIG. 5-FIG. 12 may differ from each other in at least the design of the RFLB as well as the combining element.

Generally, a FEM is a unit that interfaces between an antenna and a transceiver, and the FEM may provide functions such as, for example, power amplification, power combining, matching, filtering, duplexing, diplexing transmit/receive switching, low noise amplification and power detection. In each of the example apparatus shown in FIG. 5-FIG. 12, a RFLB added and may be internal of or external to the FEM. The RFLB may sense the PA output signal in the FEM and feeds it back to the transceiver. One use of this new RF sensing capability is to enable the use of DPD techniques in the FEM to improve the efficiency and linearity of the PA in the FEM. Functions provided by the RFLB may include, but are not limited to, the following: (1) RF sensing, (2) filtering, (3) signal amplification and/or attenuation, (4) down-conversion and (5) signal processing. An output signal of the RFLB may be demodulated in the transceiver and processed by a digital signal processor. The present disclosure provides a number of different architectures for implementation of the RFLB with FEM, as described below with reference to FIG. 5-FIG. 12.

FIG. 5 shows apparatus 500 with a first example architecture implemented therein. Apparatus 500 may include an antenna 520, a transceiver 510 configured to generate an outgoing signal and receive an incoming signal, and a FEM 530 coupled between antenna 520 and transceiver 510. Transceiver 510 may include a digital signal processor 512, a transmitter 514 and a receiver 516. FEM 530 may include a combining element 532, a PA 534, a low-noise amplifier (LNA) 536 and a RFLB circuit 538. FEM 530 may be implemented by a single integrated chip disposed outside of transceiver 510. Combining element 532 may be coupled to antenna 520 to transmit and receive signals through antenna 520. That is, combining element 532 may couple an output of PA 534, an input of LNA 536 and an input of RFLB circuit 538 to antenna 520 while providing isolation between them. Combining element 532 may include, for example, one or more of the following: a T/R switch, matching network, coupler, diplexer, duplexer and power combiner. PA 534 may be configured to receive the outgoing signal from transceiver 510 as a PA input signal and amplify the PA input signal to provide a PA output signal to antenna 520 through combining element 532. LNA 536 may be configured to receive a pre-amplified incoming signal from antenna 520 through combining element 532. LNA 536 may be also configured to amplify the pre-amplified incoming signal to provide the incoming signal to transceiver 510. That is, LNA 536 may amplify the signal received from antenna 520 with minimal additional noise contribution and deliver the amplified signal to transceiver 510. RFLB circuit 538 may be configured to sense the PA output signal and generate a loopback signal corresponding to characteristics of the PA output signal, and the loopback signal may be received by transceiver 510. That is, RFLB circuit 538 may sense the transmit signal (e.g., PA output signal), extract its relevant information and deliver the extracted information to transceiver 510. RFLB circuit 538 may be an example implementation of or otherwise similar or identical to RFLB path 300 and/or RFLB path 450, and thus may have the same or similar functions of RFLB path 300 and/or RFLB path 450 as described above.

In the example shown in FIG. 5, RFLB circuit 538 may be an integral part of FEM 530. FEM 530 may include four communication ports or pins as described below. A first port of FEM 530 (e.g., antenna port) may be configured to facilitate a signal path between antenna 520 and combining element 532. A second port of FEM 530 (e.g., PA input port) may be configured to facilitate a signal path between PA 534 and transceiver 510. A third port of FEM 530 (e.g., LNA output port) may be configured to facilitate a signal path between LNA 536 and transceiver 510. A fourth port of FEM 530 (e.g., RFLB output port) may be configured to facilitate a signal path between RFLB circuit 538 and transceiver 510.

FIG. 6 shows apparatus 600 with a second example architecture implemented therein. Apparatus 600 may include an antenna 620, a transceiver 610 configured to generate an outgoing signal and receive an incoming signal, and a FEM 630 coupled between antenna 620 and transceiver 610. Transceiver 610 may include a digital signal processor 612, a transmitter 614 and a receiver 616. FEM 630 may include a first combining element 632, a second combining element 633, a PA 634 and an LNA 636. FEM 630 may be implemented by a single integrated chip disposed outside of transceiver 610. In the example shown in FIG. 6, a RFLB circuit 638 may be external to and separate from FEM 630. First combining element 632 may be coupled to antenna 620 to transmit and receive signals through antenna 620. That is, first combining element 632 may couple an output of PA 634 and an input of LNA 636 to antenna 620 while providing isolation between them. Second combining element 633 may be coupled to an output of LNA 636, an output of RFLB circuit 638 and a receiver input port of transceiver 610. Each of first combining element 632 and second combining element 633 may include, for example, one or more of the following: a T/R switch, matching network, coupler, diplexer, duplexer and power combiner. PA 634 may be configured to receive the outgoing signal from transceiver 610 as a PA input signal and amplify the PA input signal to provide a PA output signal to antenna 620 through combining element 632. LNA 636 may be configured to receive a pre-amplified incoming signal from antenna 620 through first combining element 632. LNA 636 may be also configured to amplify the pre-amplified incoming signal to provide the incoming signal to transceiver 610. That is, LNA 636 may amplify the signal received from antenna 620 with minimal additional noise contribution and deliver the amplified signal to transceiver 610. RFLB circuit 638 may be configured to sense the PA output signal and generate a loopback signal corresponding to characteristics of the PA output signal, and the loopback signal may be received by transceiver 610. That is, RFLB circuit 638 may sense the transmit signal (e.g., PA output signal), extract its relevant information and deliver the extracted information to transceiver 610. RFLB circuit 638 may be an example implementation of or otherwise similar or identical to RFLB path 300 and/or RFLB path 450, and thus may have the same or similar functions of RFLB path 300 and/or RFLB path 450 as described above.

FEM 630 may include four communication ports or pins as described below. A first port of FEM 630 (e.g., antenna port) may be configured to facilitate a signal path between antenna 620 and first combining element 632. A second port of FEM 630 (e.g., PA input port) may be configured to facilitate a signal path between PA 634 and transceiver 610. A third port of FEM 630 (e.g., LNA output port) may be configured to facilitate a signal path between second combining element 633 and transceiver 610. A fourth port of FEM 630 (e.g., RFLB output port) may be configured to facilitate a signal path between RFLB circuit 638 and second combining element 633.

Different from apparatus 500, in apparatus 600 the RFLB circuit 638 is disposed outside of FEM 630. Nevertheless, the output signal of RFLB circuit 638 is sent to FEM 630 via a RFLB output port or pin. By adding second combing element 633, which combines the output signal of LNA 636 and the output signal of RFLB circuit 638, the signal that is provided through the LNA output port or pin is the final output. The input/sensing node of RFLB circuit 638 may be taken from the antenna port.

FIG. 7 shows apparatus 700 with a third example architecture implemented therein. Apparatus 700 may include an antenna 720, a transceiver 710 configured to generate an outgoing signal and receive an incoming signal, and a FEM 730 coupled between antenna 720 and transceiver 710. Transceiver 710 may include a digital signal processor 712, a transmitter 714 and a receiver 716. FEM 730 may include a first combining element 732, a second combining element 733, a PA 734 and an LNA 736. FEM 730 may be implemented by a single integrated chip disposed outside of transceiver 710. In the example shown in FIG. 7, a RFLB circuit 738 may be external to and separate from FEM 730. First combining element 732 may be coupled to antenna 720 to transmit and receive signals through antenna 720. That is, first combining element 732 may couple an output of PA 734 and the input of LNA 736 to antenna 720 while providing isolation between them. Second combining element 733 may be coupled to an output of LNA 736, an output of RFLB circuit 738 and a receiver input port of transceiver 710. Each of first combining element 732 and second combining element 733 may include, for example, one or more of the following: a T/R switch, matching network, coupler, diplexer, duplexer and power combiner. PA 734 may be configured to receive the outgoing signal from transceiver 710 as a PA input signal and amplify the PA input signal to provide a PA output signal to antenna 720 through combining element 732. LNA 736 may be configured to receive a pre-amplified incoming signal from antenna 720 through first combining element 732. LNA 736 may be also configured to amplify the pre-amplified incoming signal to provide the incoming signal to transceiver 710. That is, LNA 736 may amplify the signal received from antenna 720 with minimal additional noise contribution and deliver the amplified signal to transceiver 710. RFLB circuit 738 may be configured to sense the PA output signal and generate a loopback signal corresponding to characteristics of the PA output signal, and the loopback signal may be received by transceiver 710. That is, RFLB circuit 738 may sense the transmit signal (e.g., PA output signal), extract its relevant information and deliver the extracted information to transceiver 710. RFLB circuit 738 may be an example implementation of or otherwise similar or identical to RFLB path 300 and/or RFLB path 450, and thus may have the same or similar functions of RFLB path 300 and/or RFLB path 450 as described above.

FEM 730 may include five communication ports or pins as described below. A first port of FEM 730 (e.g., antenna port) may be configured to facilitate a signal path between antenna 720 and first combining element 732. A second port of FEM 730 (e.g., PA input port) may be configured to facilitate a signal path between PA 734 and transceiver 710. A third port of FEM 730 (e.g., LNA output port) may be configured to facilitate a signal path between second combining element 733 and transceiver 710. A fourth port of FEM 730 (e.g., RFLB output port) may be configured to facilitate a signal path between RFLB circuit 738 and second combining element 733. A fifth port of FEM 730 (e.g., RFLB input port) may be configured to facilitate a signal path between RFLB circuit 738 and an output node of PA 734 (e.g., between PA 734 and first combining element 732).

Different from apparatus 600, in apparatus 700 an input signal of RFLB circuit 738 is taken from the output of PA 734 before first combing element 732. Moreover, a separated port (RFLB input port) is used for RFLB circuit 738 to sense the PA output signal.

FIG. 8 shows apparatus 800 with a fourth example architecture implemented therein. Apparatus 800 may include an antenna 820, a transceiver 810 configured to generate an outgoing signal and receive an incoming signal, and a FEM 830 coupled between antenna 820 and transceiver 810. Transceiver 810 may include a digital signal processor 812, a transmitter 814 and a receiver 816. FEM 830 may include a first combining element 832, a PA 834 and an LNA 836. FEM 830 may be implemented by a single integrated chip disposed outside of transceiver 810. In the example shown in FIG. 8, both a second combining element 833 and a RFLB circuit 838 may be external to and separate from FEM 830. First combining element 832 may be coupled to antenna 820 to transmit and receive signals through antenna 820. That is, first combining element 832 may couple an output of PA 834 and the input of LNA 836 to antenna 820 while providing isolation between them. Second combining element 833 may be coupled to an output of LNA 836, an output of RFLB circuit 838 and a receiver input port of transceiver 810. Each of first combining element 832 and second combining element 833 may include, for example, one or more of the following: a T/R switch, matching network, coupler, diplexer, duplexer and power combiner. PA 834 may be configured to receive the outgoing signal from transceiver 810 as a PA input signal and amplify the PA input signal to provide a PA output signal to antenna 820 through combining element 832. LNA 836 may be configured to receive a pre-amplified incoming signal from antenna 820 through first combining element 832. LNA 836 may be also configured to amplify the pre-amplified incoming signal to provide the incoming signal to transceiver 810. That is, LNA 836 may amplify the signal received from antenna 820 with minimal additional noise contribution and deliver the amplified signal to transceiver 810. RFLB circuit 838 may be configured to sense the PA output signal and generate a loopback signal corresponding to characteristics of the PA output signal, and the loopback signal may be received by transceiver 810. That is, RFLB circuit 838 may sense the transmit signal (e.g., PA output signal), extract its relevant information and deliver the extracted information to transceiver 810. RFLB circuit 838 may be an example implementation of or otherwise similar or identical to RFLB path 300 and/or RFLB path 450, and thus may have the same or similar functions of RFLB path 300 and/or RFLB path 450 as described above.

FEM 830 may include three communication ports or pins as described below. A first port of FEM 830 (e.g., antenna port) may be configured to facilitate a signal path between antenna 820 and first combining element 832. A second port of FEM 830 (e.g., PA input port) may be configured to facilitate a signal path between PA 834 and transceiver 810. A third port of FEM 830 (e.g., LNA output port) may be configured to facilitate a signal path between second combining element 833 and LNA 836.

Different from apparatus 600, in apparatus 800 second combining element 833 is disposed outside of FEM 830, which is a separated block. So there are only 3 ports in FEM, which are antenna, PA input and LNA output. The input/sensing node of RFLB circuit 838 may be taken from the antenna port.

FIG. 9 shows apparatus 900 with a fifth example architecture implemented therein. Apparatus 900 may include an antenna 920, a transceiver 910 configured to generate an outgoing signal and receive an incoming signal, and a FEM 930 coupled between antenna 920 and transceiver 910. Transceiver 910 may include a digital signal processor 912, a transmitter 914 and a receiver 916. FEM 930 may include a first combining element 932, a second combining element 933, a PA 934, an LNA 936 and a RFLB circuit 938. FEM 930 may be implemented by a single integrated chip disposed outside of transceiver 910. First combining element 932 may be coupled to antenna 920 to transmit and receive signals through antenna 920. That is, first combining element 932 may couple an output of PA 934 and the input of LNA 936 to antenna 920 while providing isolation between them. Second combining element 933 may be coupled to an output of LNA 936, an output of RFLB circuit 938 and a receiver input port of transceiver 910. Each of first combining element 932 and second combining element 933 may include, for example, one or more of the following: a T/R switch, matching network, coupler, diplexer, duplexer and power combiner. PA 934 may be configured to receive the outgoing signal from transceiver 910 as a PA input signal and amplify the PA input signal to provide a PA output signal to antenna 920 through combining element 932. LNA 936 may be configured to receive a pre-amplified incoming signal from antenna 920 through first combining element 932. LNA 936 may be also configured to amplify the pre-amplified incoming signal to provide the incoming signal to transceiver 910. That is, LNA 936 may amplify the signal received from antenna 920 with minimal additional noise contribution and deliver the amplified signal to transceiver 910. RFLB circuit 938 may be configured to sense the PA output signal and generate a loopback signal corresponding to characteristics of the PA output signal, and the loopback signal may be received by transceiver 910. That is, RFLB circuit 938 may sense the transmit signal (e.g., PA output signal), extract its relevant information and deliver the extracted information to transceiver 910. RFLB circuit 938 may be an example implementation of or otherwise similar or identical to RFLB path 300 and/or RFLB path 450, and thus may have the same or similar functions of RFLB path 300 and/or RFLB path 450 as described above.

FEM 930 may include three communication ports or pins as described below. A first port of FEM 930 (e.g., antenna port) may be configured to facilitate a signal path between antenna 920 and first combining element 932. A second port of FEM 930 (e.g., PA input port) may be configured to facilitate a signal path between PA 934 and transceiver 910. A third port of FEM 930 (e.g., LNA output port) may be configured to facilitate a signal path between second combining element 933 and transceiver 910.

Different from apparatus 700, in apparatus 900 RFLB circuit 938 is internal of FEM 930 and thus fewer communication ports or pins or pins are required.

FIG. 10 shows apparatus 1000 with a sixth example architecture implemented therein. Apparatus 1000 may include an antenna 1020, a transceiver 1010 configured to generate an outgoing signal and receive an incoming signal, and a FEM 1030 coupled between antenna 1020 and transceiver 1010. Transceiver 1010 may include a digital signal processor 1012, a transmitter 1014 and a receiver 1016. FEM 1030 may include a first combining element 1032, a second combining element 1033, a PA 1034, an LNA 1036 and a RFLB circuit 1038. FEM 1030 may be implemented by a single integrated chip disposed outside of transceiver 1010. First combining element 1032 may be coupled to antenna 1020 to transmit and receive signals through antenna 1020. That is, first combining element 1032 may couple an output of PA 1034 and the input of LNA 1036 to antenna 1020 while providing isolation between them. Second combining element 1033 may be coupled to an output of LNA 1036, an output of RFLB circuit 1038 and a receiver input port of transceiver 1010. Each of first combining element 1032 and second combining element 1033 may include, for example, one or more of the following: a T/R switch, matching network, coupler, diplexer, duplexer and power combiner. PA 1034 may be configured to receive the outgoing signal from transceiver 1010 as a PA input signal and amplify the PA input signal to provide a PA output signal to antenna 1020 through combining element 1032. LNA 1036 may be configured to receive a pre-amplified incoming signal from antenna 1020 through first combining element 1032. LNA 1036 may be also configured to amplify the pre-amplified incoming signal to provide the incoming signal to transceiver 1010. That is, LNA 1036 may amplify the signal received from antenna 1020 with minimal additional noise contribution and deliver the amplified signal to transceiver 1010. RFLB circuit 1038 may be configured to sense the PA output signal and generate a loopback signal corresponding to characteristics of the PA output signal, and the loopback signal may be received by transceiver 1010. That is, RFLB circuit 1038 may sense the transmit signal (e.g., PA output signal), extract its relevant information and deliver the extracted information to transceiver 1010. RFLB circuit 1038 may be an example implementation of or otherwise similar or identical to RFLB path 300 and/or RFLB path 450, and thus may have the same or similar functions of RFLB path 300 and/or RFLB path 450 as described above.

FEM 1030 may include three communication ports or pins as described below. A first port of FEM 1030 (e.g., antenna port) may be configured to facilitate a signal path between antenna 1020 and first combining element 1032. A second port of FEM 1030 (e.g., PA input port) may be configured to facilitate a signal path between PA 1034 and transceiver 1010. A third port of FEM 1030 (e.g., LNA output port) may be configured to facilitate a signal path between second combining element 1033 and transceiver 1010.

Different from apparatus 900, in apparatus 1000 FEM 1030 may also include a signal sensing element 1037 and a down converter 1039 coupled between RFLB circuit 1038 and an output node of PA 1034 (e.g., between PA 1034 and first combining element 1032). That is, the PA output signal, which is a radio frequency signal, may be sensed by signal sensing element 1037 and then down-converted to baseband by down converter 1039, whose frequency may be different from the frequency of the PA output signal. The output of down converter 1039 may be sent to RFLB circuit 1038 for the further processing. The output of LNA 1036 and the output of RFLB circuit 1038 may be combined by second combing element 1033 and sent to a receiver input port of transceiver 1010 through the LNA output port or pin.

FIG. 11 shows apparatus 1100 with a seventh example architecture implemented therein. Apparatus 1100 may include an antenna 1120, a transceiver 1110 configured to generate an outgoing signal and receive an incoming signal, and a FEM 1130 coupled between antenna 1120 and transceiver 1110. Transceiver 1110 may include a digital signal processor 1112, a transmitter 1114 and a receiver 1116. FEM 1130 may include a first combining element 1132, a second combining element 1133, a PA 1134, an LNA 1136 and a RFLB circuit 1138. FEM 1130 may be implemented by a single integrated chip disposed outside of transceiver 1110. First combining element 1132 may be coupled to antenna 1120 to transmit and receive signals through antenna 1120. That is, first combining element 1132 may couple an output of PA 1134 and the input of LNA 1136 to antenna 1120 while providing isolation between them. Second combining element 1133 may be coupled to an output of LNA 1136, an output of RFLB circuit 1138 and a receiver input port of transceiver 1110. Each of first combining element 1132 and second combining element 1133 may include, for example, one or more of the following: a T/R switch, matching network, coupler, diplexer, duplexer and power combiner. PA 1134 may be configured to receive the outgoing signal from transceiver 1110 as a PA input signal and amplify the PA input signal to provide a PA output signal to antenna 1120 through combining element 1132. LNA 1136 may be configured to receive a pre-amplified incoming signal from antenna 1120 through first combining element 1132. LNA 1136 may be also configured to amplify the pre-amplified incoming signal to provide the incoming signal to transceiver 1110. That is, LNA 1136 may amplify the signal received from antenna 1120 with minimal additional noise contribution and deliver the amplified signal to transceiver 1110. RFLB circuit 1138 may be configured to sense the PA output signal and generate a loopback signal corresponding to characteristics of the PA output signal, and the loopback signal may be received by transceiver 1110. That is, RFLB circuit 1138 may sense the transmit signal (e.g., PA output signal), extract its relevant information and deliver the extracted information to transceiver 1110. RFLB circuit 1138 may be an example implementation of or otherwise similar or identical to RFLB path 300 and/or RFLB path 450, and thus may have the same or similar functions of RFLB path 300 and/or RFLB path 450 as described above.

FEM 1130 may include three communication ports or pins as described below. A first port of FEM 1130 (e.g., antenna port) may be configured to facilitate a signal path between antenna 1120 and first combining element 1132. A second port of FEM 1130 (e.g., PA input port) may be configured to facilitate a signal path between PA 1134 and transceiver 1110. A third port of FEM 1130 (e.g., LNA output port) may be configured to facilitate a signal path between second combining element 1133 and transceiver 1110.

Compared to apparatus 900, in apparatus 1100 a different method to sense the PA output signal, which is a radio frequency signal, is provided. Specifically, FEM 1130 may utilize a two-die solution in that there may be two dies inside FEM 1130, including a first die 1142 and a second die 1144. First die 1142 may include first combining element 1132, and second die 1144 may include PA 1134, LNA 1136, RFLB circuit 1138 and second combining element 1133. FEM 1130 may also include a first bond wire 1152 and a second bond wire 1154. First bond wire 1152 may connect an output port of PA 1134 to first combining element 1132, and second bond wire 1154 may connect first combining element 1132 to a node that is coupled to an input port of LNA 1136 and an input port of RFLB circuit 1138. Taking advantage of mutual coupling between first bond wire 1152 and second bond wire 1154 (indicated by label k12 in FIG. 11), the PA output signal may be sensed to the input of RFLB circuit 1138 for RFLB circuit 1138 to operate properly.

FIG. 12 shows apparatus 1200 with an eighth example architecture implemented therein. Apparatus 1200 may include an antenna 1220, a transceiver 1210 configured to generate an outgoing signal and receive an incoming signal, and a FEM 1230 coupled between antenna 1220 and transceiver 1210. Transceiver 1210 may include a digital signal processor 1212, a transmitter 1214 and a receiver 1216. FEM 1230 may include a first combining element 1232, a second combining element 1233, a PA 1234, an LNA 1236 and a RFLB circuit 1238. FEM 1230 may be implemented by a single integrated chip disposed outside of transceiver

1210. First combining element 1232 may be coupled to antenna 1220 to transmit and receive signals through antenna 1220. That is, first combining element 1232 may couple an output of PA 1234 and the input of LNA 1236 to antenna 1220 while providing isolation between them. Second combining element 1233 may be coupled to an output of LNA 1236, an output of RFLB circuit 1238 and a receiver input port of transceiver 1210. Each of first combining element 1232 and second combining element 1233 may include, for example, one or more of the following: a T/R switch, matching network, coupler, diplexer, duplexer and power combiner. PA 1234 may be configured to receive the outgoing signal from transceiver 1210 as a PA input signal and amplify the PA input signal to provide a PA output signal to antenna 1220 through combining element 1232. LNA 1236 may be configured to receive a pre-amplified incoming signal from antenna 1220 through first combining element 1232. LNA 1236 may be also configured to amplify the pre-amplified incoming signal to provide the incoming signal to transceiver 1210. That is, LNA 1236 may amplify the signal received from antenna 1220 with minimal additional noise contribution and deliver the amplified signal to transceiver 1210. RFLB circuit 1238 may be configured to sense the PA output signal and generate a loopback signal corresponding to characteristics of the PA output signal, and the loopback signal may be received by transceiver 1210. That is, RFLB circuit 1238 may sense the transmit signal (e.g., PA output signal), extract its relevant information and deliver the extracted information to transceiver 1210. RFLB circuit 1238 may be an example implementation of or otherwise similar or identical to RFLB path 300 and/or RFLB path 450, and thus may have the same or similar functions of RFLB path 300 and/or RFLB path 450 as described above.

FEM 1230 may include three communication ports or pins as described below. A first port of FEM 1230 (e.g., antenna port) may be configured to facilitate a signal path between antenna 1220 and first combining element 1232. A second port of FEM 1230 (e.g., PA input port) may be configured to facilitate a signal path between PA 1234 and transceiver 1210. A third port of FEM 1230 (e.g., LNA output port) may be configured to facilitate a signal path between second combining element 1233 and transceiver 1210.

Compared to apparatus 900, in apparatus 1200 a different method to sense the PA output signal, which is a radio frequency signal, is provided. Specifically, FEM 1230 may utilize a two-die solution in that there may be two dies inside FEM 1230, including a first die 1242 and a second die 1244. First die 1242 may include first combining element 1232, and second die 1244 may include PA 1234, LNA 1236, RFLB circuit 1238 and second combining element 1233. FEM 1230 may also include a first bond wire 1252, a second bond wire 1254 and a third bond wire 1256. First bond wire 1252 may connect first combining element 1232 and an output port of PA 1234, second bond wire 1254 may connect first combining element 1232 and an input port of LNA 1236, and third bond wire 1256 may connect first combining element 1232 and an input port of RFLB circuit 1238. Taking advantage of mutual coupling between first bond wire 1252 and second bond wire 1254 and between first bond wire 1252 and third bond wire 12 56 (indicated by label k12 and k13 in FIG. 12, respectively), the PA output signal may be sensed to the input of RFLB circuit 1238 for RFLB circuit 1238 to operate properly. This design provides more flexibility to RFLB circuit 1238 and LNA 1236 in that RFLB circuit 1238 and LNA 1236 do not disturb each other.

Figure 13:
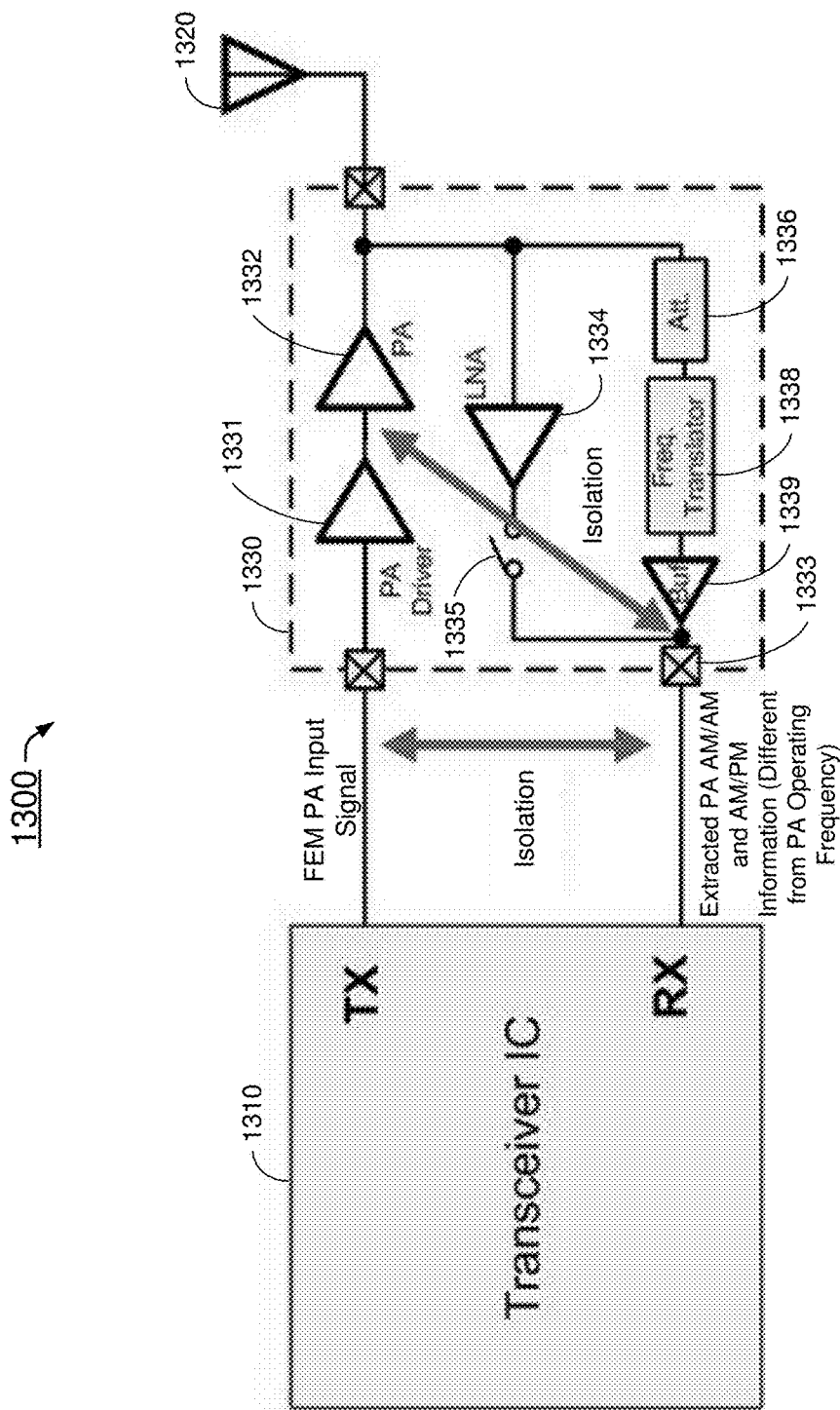
FIG. 13 is a block diagram of an example apparatus having an integrated loopback circuit with a frequency translator in accordance with an implementation of the present disclosure.

FIG. 13 illustrates an example apparatus 1300 having an integrated loopback circuit with a frequency translator in accordance with an implementation of the present disclosure.

With respect to apparatus 1300, it is possible that a design may deploy a loopback inside a FEM based on experience from previous design of transceiver loopback, to provide calibration for the FEM such as, for example, DPD, offset, gain and notching filters, and so on. However, there are differentiations between FEM loopback and transceiver loopback. One of the main challenges in FEM loopback is how to guarantee the fidelity of the extracted loopback signal. Take DPD PA calibration for example, there may exist isolation between a transmitter port (TX) and a receiver port (RX). There may also exist on-chip isolation between internal nodes of the PA and internal nodes of the RFLB. Undesirably, a resultant coupling tends to ruin the loopback signal and, as a result, a DPD engine inside the transceiver cannot correct the real distortion at the antenna. This unwanted coupling tends to occur when transmit signal and loopback signal operate at the same frequency. The design of apparatus 1300 is aimed to address this issue. In particular, in apparatus 1300, the loopback signal is at a frequency different from a frequency of a transmit signal. Accordingly, the issue with unwanted coupling is addressed.

Referring to FIG. 13, apparatus 1300 may include an antenna 1320, a transceiver 1310 configured to generate an outgoing signal and receive an incoming signal, a PA 1332, a PA driver 1331 configured to drive PA 1332, a LNA 1334, a switch 1335, and a loopback path. PA 1332 may be configured to receive the outgoing signal from transceiver 1310 as a PA input signal and amplify the PA input signal to provide a PA output signal to antenna 1320. LNA 1334 may be configured to receive a pre-amplified incoming signal from antenna 1320 and amplify the pre-amplified incoming signal to provide the incoming signal to transceiver 1310. The loopback path may be coupled in parallel with LNA 1334. The loopback path may be configured to sense the PA output signal and generate a loopback signal corresponding to characteristics of the PA output signal. The loopback path may operate at a first frequency which is different from a second frequency of the outgoing signal. The loopback signal may be received by transceiver 1310.

As shown in FIG. 13, an output of LNA 1334 and an output of the loopback path may be electrically connected to an output pin 1333 which is electrically connected to transceiver 1310. Switch 1335 may be coupled between the output of LNA 1334 and output pin 1333. Switch 1335 may be configured to connect LNA 1334 to output pin 1333 when the loopback path is deactivated, the switch further configured to disconnect the LNA from output pin 1333 when the loopback path is activated.

As shown in FIG. 13, loopback path may include an attenuator 1336, a frequency translator 1338 and a buffer 1339. Attenuator 1336 may be configured to receive and attenuate the PA output signal to output an attenuated signal. Frequency translator 1338 may be configured to receive the attenuated signal and generate a frequency-translated signal having the first frequency. Buffer 1339 may be configured to receive the frequency-translated signal and provide the loopback signal.

In some implementations, PA 1332, PA driver 1331, LNA 1334, switch 1335 and the loopback path (including attenuator 1336, frequency translator 1338 and buffer 1339) may be integral parts of a front-end module (FEM) 1330.

It is noteworthy that a key point demonstrated in the example shown in FIG. 13 is that the output AM/AM (amplitude-to-amplitude modulation) and AM/PM (amplitude-to-phase modulation) information of PA 1332 is extracted through frequency translator 1338. Therefore, the output signal of the RF loopback path is operating at a frequency different from the operating frequency of PA 1332. Even with couplings between PA 1332 and the RF loopback path, such couplings can be easily separated. The fidelity of the RF loopback path is thus guaranteed. Notably, no phase alternator is employed in the RF loopback path in the example shown in FIG. 13.

By introducing frequency translator 1338 in the loopback path, the coupling is not an issue any more. Moreover, the output pin 1333 may be shared between LNA 1334 and the loopback path by a simple series switch 1335. Advantageously, with this design, leakage or substrate coupling through LNA 1334 to the loopback path will not ruin the quality of the loopback signal.

Figure 14:
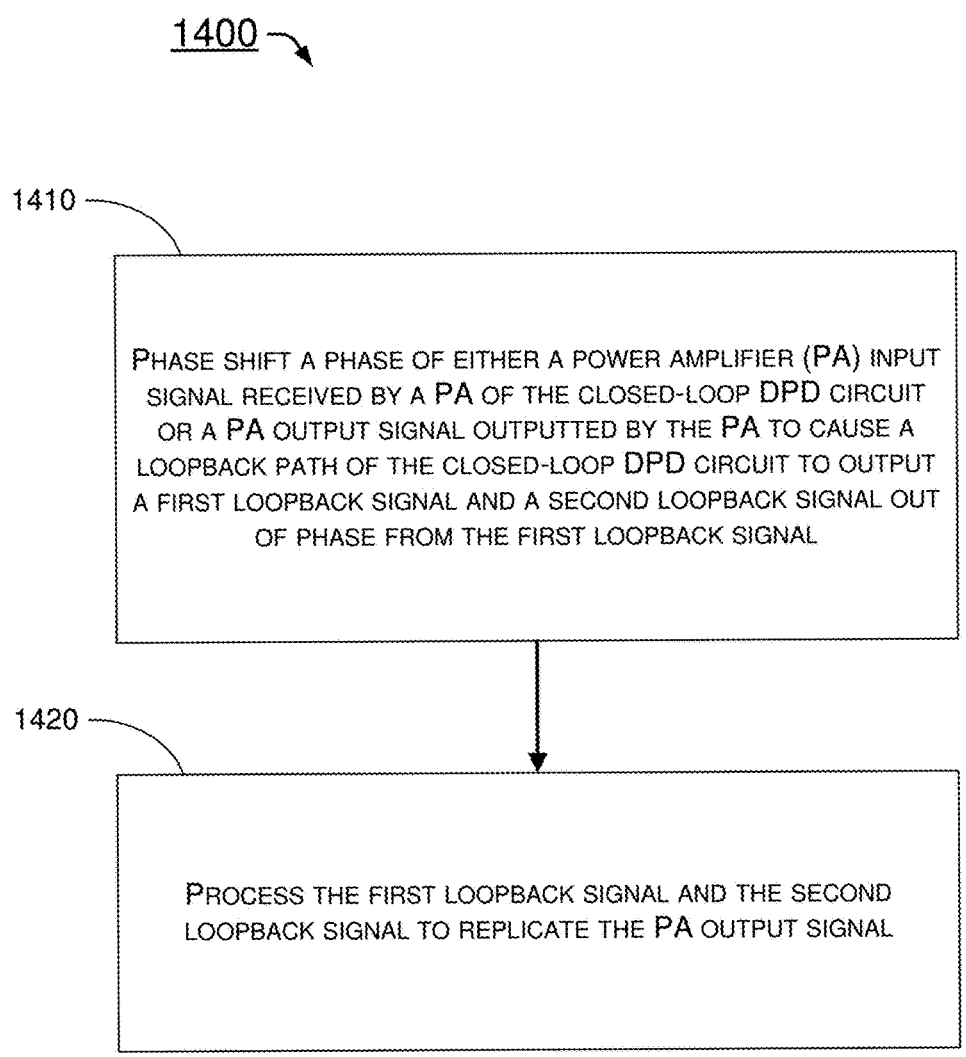
FIG. 14 is a flowchart of an example process in accordance with an implementation of the present disclosure.

FIG. 14 illustrates an example process 1400 in accordance with an implementation of the present disclosure. Process 1400 may include one or more operations, actions, or functions as illustrated by one or more of blocks 1410 and 1420. Although illustrated as discrete blocks, various blocks may be divided into additional blocks, combined into fewer blocks, or eliminated, depending on the desired implementation. Process 1400 may be implemented by circuit 100, circuit 200, RFLB path 300, closed-loop DPD circuit 400, apparatus 500, apparatus 600, apparatus 700, apparatus 800, apparatus 900, apparatus 1000, apparatus 1100 and apparatus 1200. For illustrative purposes, a description of the operations of process 1400 is provided below in the context of process 1400 being performed by closed-loop DPD circuit 400. Process 1400 may begin at block 1410.

At block 1410, process 1400 may involve RFLB path 450 of closed-loop DPD circuit 440 performing phase shifting of a phase of either a PA input signal received by PA 440 of closed-loop DPD circuit 440 or a PA output signal outputted by PA 440 to cause RFLB path 450 to output a first loopback signal and a second loopback signal which has a non-zero phase shift from the first loopback signal. Block 1410 may be followed by block 1420.

At block 1410, process 1400 may involve RFLB path 450 processing the first loopback signal and the second loopback signal to replicate the PA output signal. PA 440 may be configured to receive the PA input signal and amplify the PA input signal to provide the PA output signal which is proportional to a product of the PA input signal and a gain of PA 440 (e.g., $G_{PA}$). RFLB path 450 may be coupled to receive the PA output signal to provide an output which is proportional to a product of the PA output signal and a gain of RFLB path 450 (e.g., $G_{RFLB}$). A forward coupling and a backward coupling may exist between the PA input signal and the output of RFLB path 450.

In some implementations, the first loopback signal and the second loopback signal may differ from each other by a phase shift of 180°.

In some implementations, in performing the phase shifting, process 1400 may involve RFLB path 450 phase shifting the phase of the PA input signal. Alternatively, in performing the phase shifting, process 1400 may involve RFLB path 450 phase shifting the phase of the PA output signal.

In some implementations, process 1400 may involve RFLB path 450 performing the phase shifting and the processing when closed-loop DPD circuit 400 is in a calibration mode. Additionally, when closed-loop DPD circuit 400 is in a normal operation mode, process 1400 may involve closed-loop DPD circuit 400 disabling RFLB path 450 and performing DPD processing using the replicated PA output signal.

In some implementations, when closed-loop DPD circuit 400 is in the calibration mode, process 1400 may also involve RFLB path 450 processing the first loopback signal and the second loopback signal to determine a coupling effect caused by the forward coupling and the backward coupling. The coupling effect may be approximately proportional to a sum of the first loopback signal and the second loopback signal. Additionally, process 1400 may involve closed-loop DPD circuit 400 calibrating DPD calibration engine 410 using a signal derived from the PA output signal based at least in part on the coupling effect in real-time or in an adaptive manner. For instance, for real-time DPD, the RFLB path may be enabled and DPD calibration may be applied all the time. That is, when calibrating in a real-time manner, RFLB path 450 may be kept enabled to perform DPD calibration. Also for instance, for adaptive DPD, the RFLB path may be enabled and DPD calibration may be applied when needed. That is, when calibrating in an adaptive manner, RFLB path 450 may be enabled as needed to perform DPD calibration. Moreover, when closed-loop DPD circuit 400 is in the normal operation mode, process 1400 may involve filtering an output of RFLB path 450 with coupling compensation filter 470 having a filtering coefficient that is set based on the coupling effect. Process 1400 may also involve ADC 460 converting the filtered output of RFLB path 450 to a digital signal. Process 1400 may further involve DPD calibration engine 410 performing DPD processing using the digital signal.

Figure 15:
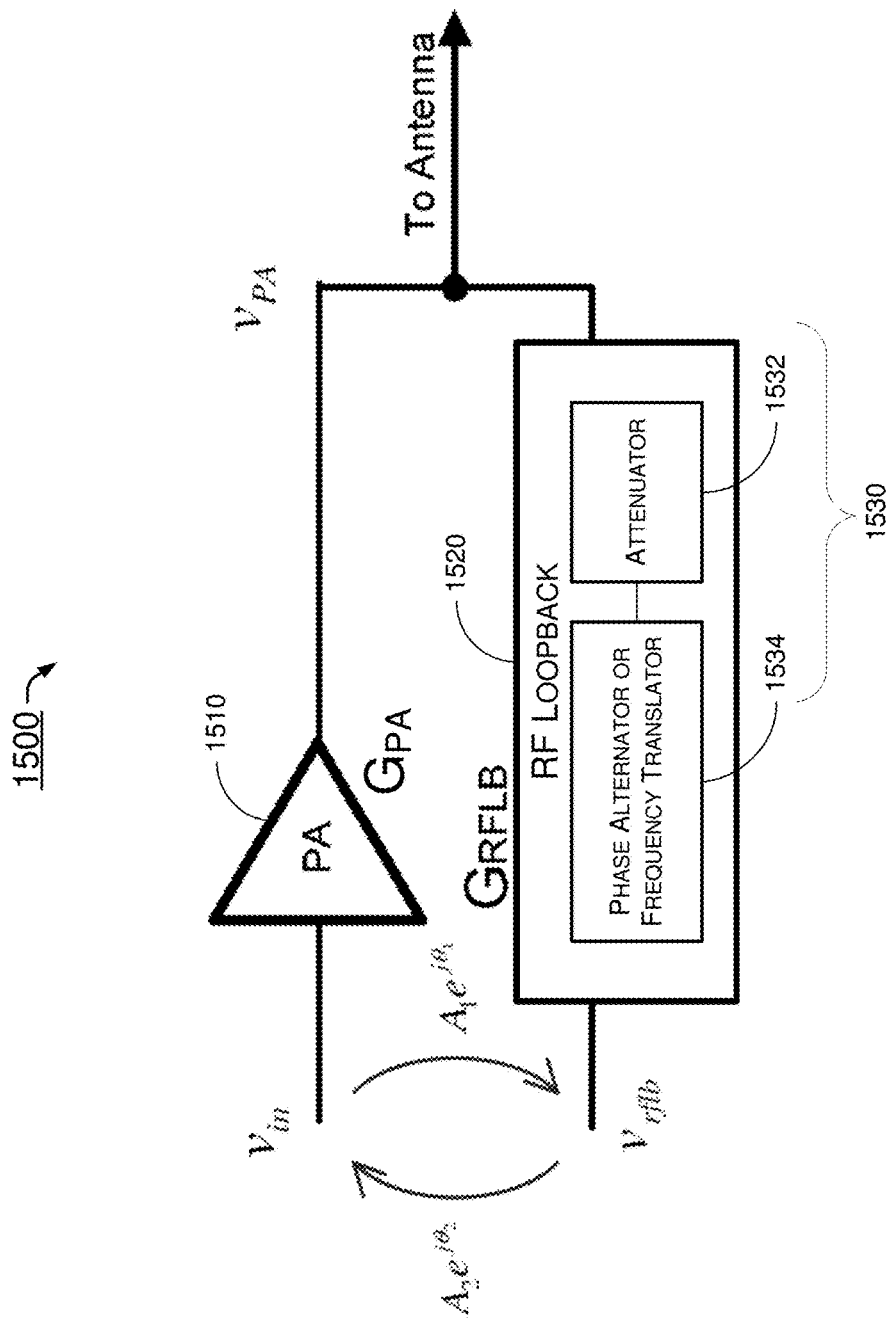
FIG. 15 is a block diagram of a portion of an example closed-loop DPD system in accordance with a further implementation of the present disclosure.
Figure 16:
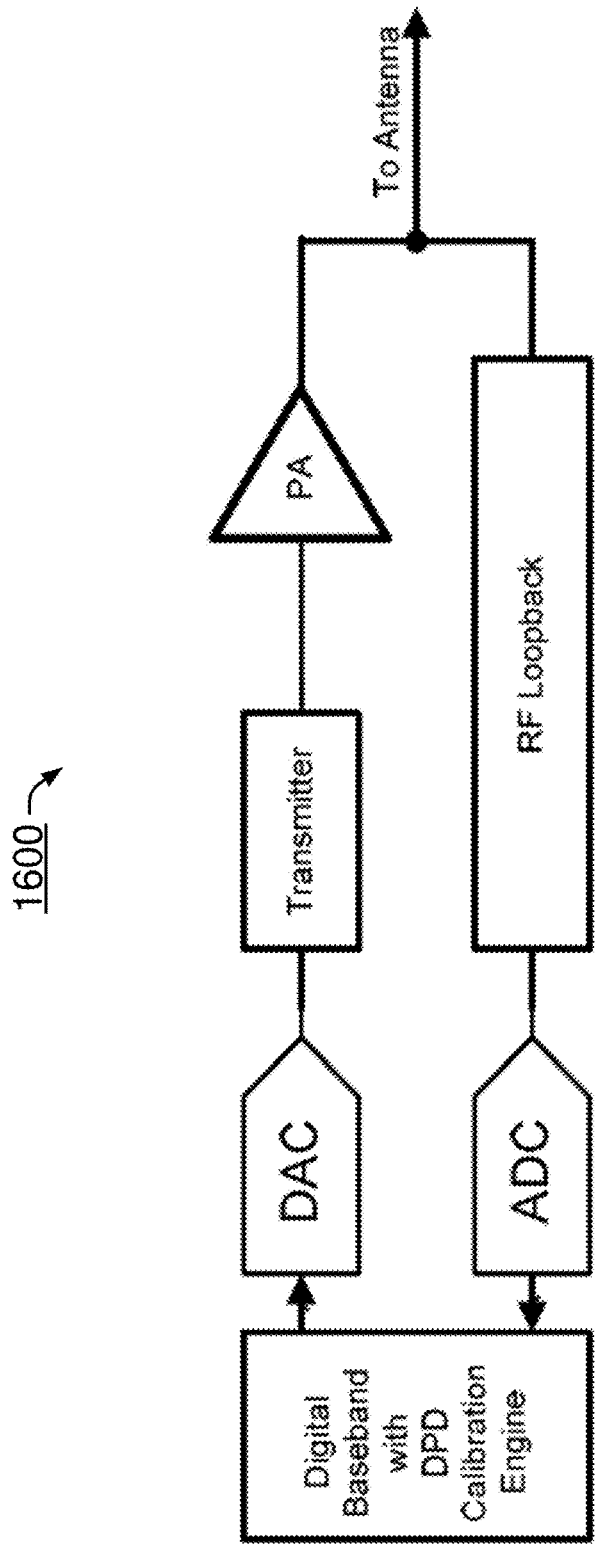
FIG. 16 is a block diagram of a conventional closed-loop DPD circuit during calibration and during normal operation.
Figure 17:
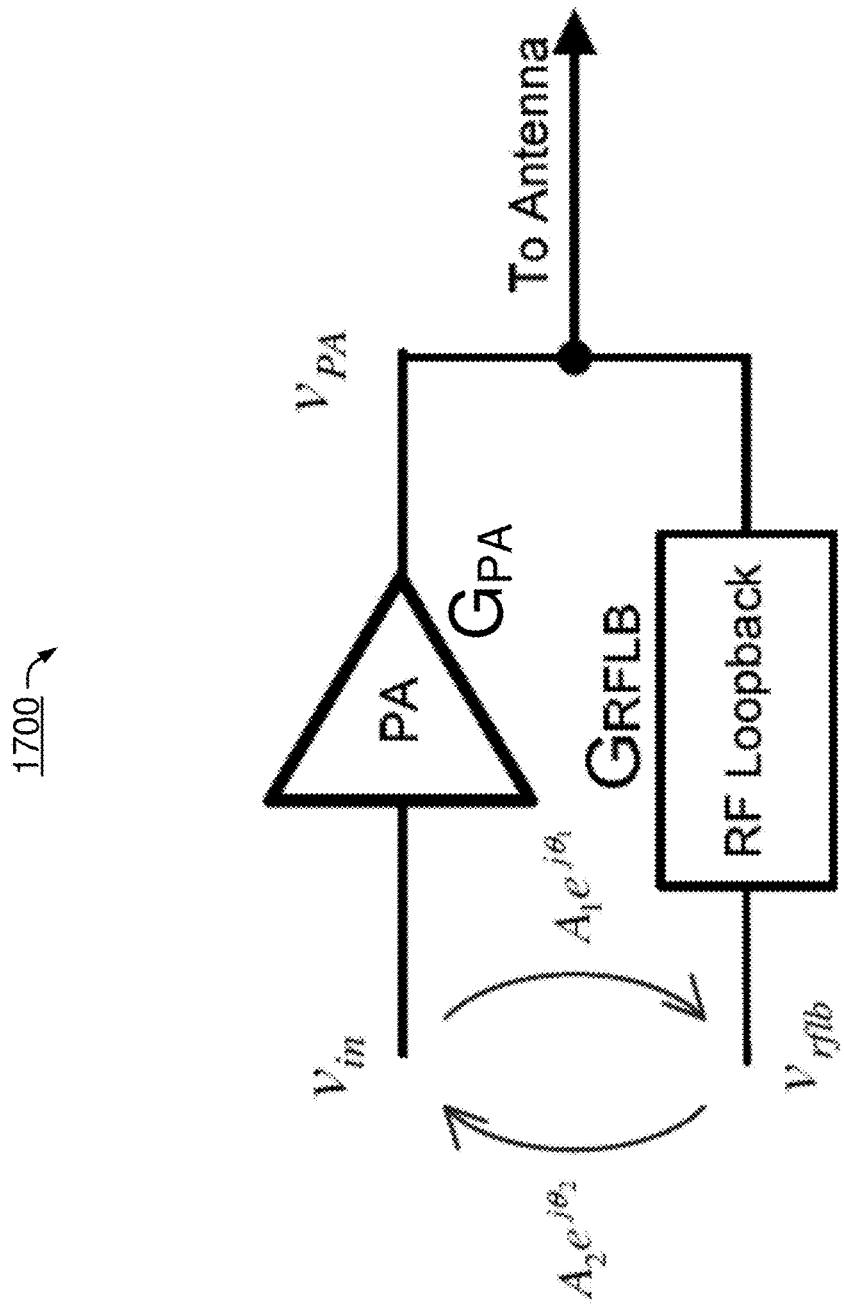
FIG. 17 is a block diagram of a portion of a conventional closed-loop DPD system with unwanted couplings.

FIG. 15 illustrates an example circuit 1500 of an example closed-loop DPD system in accordance with a further implementation of the present disclosure. As shown in FIG. 15, circuit 1500 may include a PA 1510 and a radio frequency loopback (RFLB) path 1520. PA 1510 may receive an input, $V_{in}$, and provide an output, $V_{PA}$, which may be proportional to a product of the PA input signal and a gain of PA 1510 and may be provided to an antenna for transmission. RFLB path 1520, taking $V_{PA}$ as an input, may provide an output $V_{rflb}$. In circuit 1500, effects of unwanted couplings (e.g., forward coupling $A_1 e^{j\Theta_1}$ and backward coupling $A_2 e^{j\Theta_2}$) in a loopback signal outputted by RFLB path 1520 may be removed, cancelled or otherwise minimized by a coupling cancellation mechanism 1530. Coupling cancellation mechanism 1530 may include an attenuator 1532 and a device 1534. Attenuator 1532 may be configured to receive and attenuate the PA output signal to output an attenuated signal. In some implementations, device 1534 may include a phase alternator configured to receive the attenuated signal and shift a phase of the attenuated signal to output a first loopback signal and a second loopback signal with a non-zero phase shift from the first loopback signal. A difference between the first loopback signal and the second loopback signal may be at least approximately linearly proportional to a product of the gain of PA 1510 and a gain of RFLB path 1520. Alternatively, device 1534 may include a frequency translator configured to receive the attenuated signal and output a frequency-translated signal having a frequency different from a frequency of the PA input signal.

Highlights of Select Features

In view of the above, select features of the present disclosure are highlighted below.

In one aspect, a closed-loop DPD circuit may include a PA and a loopback path. The PA may be configured to receive a PA input signal and amplify the PA input signal to provide a PA output signal which may be proportional to a product of the PA input signal and a gain of the PA. The loopback path may be coupled to receive the PA output signal to output a loopback signal. A forward coupling and a backward coupling may exist between the PA input signal and an output of the loopback path. The output of the loopback path may be proportional to a product of the PA output signal and a gain of the loopback path. The loopback path may include a coupling cancellation mechanism configured to cancel at least a portion of couplings between the PA input signal and the loopback signal.

In some implementations, the coupling cancellation mechanism may include an attenuator and a phase alternator. The attenuator may be configured to receive and attenuate the PA output signal to output an attenuated signal. The phase alternator may be configured to receive the attenuated signal and shift a phase of the attenuated signal to output a first loopback signal and a second loopback signal with a non-zero phase shift from the first loopback signal such that a difference between the first loopback signal and the second loopback signal is at least approximately linearly proportional to a product of the gain of the PA and a gain of the loopback path.

In some implementations, the coupling cancellation mechanism may include an attenuator and a frequency translator. The attenuator may be configured to receive and attenuate the PA output signal to output an attenuated signal. The frequency translator may be configured to receive the attenuated signal and output a frequency-translated signal having a frequency different from a frequency of the PA input signal.

In another aspect, a closed-loop DPD circuit may include a PA, a loopback path and a phase shifting element. The PA may be configured to receive a PA input signal and amplify the PA input signal to provide a PA output signal which is proportional to a product of the PA input signal and a gain of the PA. The loopback path may be coupled to receive the PA output signal. A forward coupling and a backward coupling may exist between the PA input signal and an output of the loopback path. The output of the loopback path may be proportional to a product of the PA output signal and a gain of the loopback path. The phase shifting element may be configured to shift a phase of either the PA input signal or the PA output signal to cause the loopback path to output a first loopback signal and a second loopback signal with a non-zero phase shift from the first loopback signal such that a difference between the first loopback signal and the second loopback signal is at least approximately linearly proportional to a product of the gain of the PA and a gain of the loopback path.

In some implementations, the first loopback signal and the second loopback signal may differ from each other by a phase shift of 180°.

In some implementations, the phase shifting element may be coupled to receive the PA input signal to shift the phase of the PA input signal. Alternatively, the phase shifting element may be coupled to receive the PA output signal to shift the phase of the PA output signal.

In some implementations, the loopback path may include a first attenuator, a phase alternator, a second attenuator, a down converter and a buffer. The first attenuator may be configured to receive and attenuate the PA output signal to output a first attenuated signal. The phase alternator may function as the phase shifting element and may be coupled to receive the first attenuated signal. The phase alternator may be configured to shift a phase of the first attenuated signal to output a phase alternator output signal. The second attenuator may be configured to receive and attenuate the phase alternator output signal to output a second attenuated signal. The down converter may be configured to receive and down convert the second attenuated signal from a first frequency to a second frequency lower than the first frequency. The buffer may be coupled between the second attenuator and the down converter. The buffer may be configured to drive the down converter.

In some implementations, the closed-loop DPD circuit may further include a DPD calibration engine, a DAC, a transmitter and an ADC. The DPD calibration engine may be configured to output a pre-distorted signal. The DAC may be coupled to receive the pre-distorted signal and configured to convert the pre-distorted signal to output an analog signal. The transmitter may be coupled to receive the analog signal and configured to output the PA input signal based on the analog signal. The ADC may be coupled to receive an output of the loopback path and configured to convert the output of the loopback path to a digital signal. The DPD calibration engine may be coupled to receive the digital signal and configured to generate the pre-distorted signal based at least in part on the digital signal.

In some implementations, in a calibration mode, the loopback path may be configured to output multiple loopback signals at different phases. The loopback path may be also configured to process the multiple loopback signals at different phases to replicate the PA output signal approximately. The loopback path may be further configured to process the multiple loopback signals at different phases to determine a coupling effect caused by the forward coupling and the backward coupling.

In some implementations, the closed-loop DPD circuit may further include a coupling compensation filter coupled between the ADC and the loopback path and configured to filter an output of the loopback path before the output of the loopback path is converted to the digital signal by the ADC. The coupling compensation filter may have a filtering coefficient that is set based on a coupling effect caused by the forward coupling and the backward coupling. In some implementations, the coupling effect may be approximately proportional to a sum of the first loopback signal and the second loopback signal.

In some implementations, in a normal operation mode, the loopback path may be configured to receive the PA output signal and output the loopback signal. The coupling compensation filter may be configured to filter out the coupling effect from the loopback signal prior to the loopback signal being converted to the digital signal by the ADC. The DPD calibration engine may be configured to perform DPD processing using the digital signal received from the ADC with the coupling effect filtered out.

In yet another aspect, an apparatus may include an antenna, a transceiver configured to generate an outgoing signal and receive an incoming signal, a front-end module (FEM) coupled between the antenna and the transceiver, and a loopback circuit. The FEM may include a combining element, a PA, and a low-noise amplifier (LNA). The combining element, which may be a T/R switch for example, may be coupled to the antenna to transmit and receive signals through the antenna. The PA may be configured to receive the outgoing signal from the transceiver as a PA input signal and amplify the PA input signal to provide a PA output signal to the antenna through the combining element. The LNA may be configured to receive a pre-amplified incoming signal from the antenna through the combining element, the LNA further configured to amplify the pre-amplified incoming signal to provide the incoming signal to the transceiver. The loopback circuit may be configured to sense the PA output signal and generate a loopback signal corresponding to characteristics of the PA output signal. The loopback signal may be received by the transceiver.

In some implementations, the loopback circuit may be configured to perform one or more operations comprising RF sensing, filtering, signal amplification, signal attenuation, signal down-conversion, and signal processing.

In some implementations, the loopback circuit may be an integral part of the FEM. The FEM may include a plurality of communication ports or pins such as the following: a first port configured to facilitate a signal path between the antenna and the combining element, a second port configured to facilitate a signal path between the PA and the transceiver, a third port configured to facilitate a signal path between the LNA and the transceiver, and a fourth port configured to facilitate a signal path between the loopback circuit and the transceiver. An example is apparatus 500 shown in FIG. 5.

In some implementations, the loopback circuit may be external to the FEM. The combining element may include a first combining element and a second combining element, each of which may be a T/R switch for example. The first combining element may be coupled between the PA, the LNA and the antenna to provide the PA output signal from the PA to the antenna and to provide the pre-amplified incoming signal from the antenna to the LNA. The second combining element may be coupled between the LNA, the loopback circuit and the transceiver to provide the incoming signal from the LNA to the transceiver and to provide the loopback signal from the loopback circuit to the transceiver. The FEM may include a plurality of communication ports or pins such as the following: a first port configured to facilitate a signal path between the antenna and the first combining element, a second port configured to facilitate a signal path between the PA and the transceiver, a third port configured to facilitate a signal path between the second combining element and the transceiver, and a fourth port configured to facilitate a signal path between the loopback circuit and the second combining element. The loopback circuit may be coupled to receive the PA output signal from a node on the signal path between the antenna and the first combining element. An example is apparatus 600 shown in FIG. 6.

In some implementations, the loopback circuit may be external to the FEM. The combining element may include a first combining element and a second combining element, each of which may be a T/R switch for example. The first combining element may be coupled between the PA, the LNA and the antenna to provide the PA output signal from the PA to the antenna and to provide the pre-amplified incoming signal from the antenna to the LNA. The second combining element may be coupled between the LNA, the loopback circuit and the transceiver to provide the incoming signal from the LNA to the transceiver and to provide the loopback signal from the loopback circuit to the transceiver. The loopback circuit may be coupled to receive the PA output signal from an output of the PA. The FEM may include a plurality of communication ports or pins such as the following: a first port configured to facilitate a signal path between the antenna and the first combining element, a second port configured to facilitate a signal path between the PA and the transceiver, a third port configured to facilitate a signal path between the second combining element and the transceiver, a fourth port configured to facilitate a signal path between the loopback circuit and the second combining element, and a fifth port configured to facilitate a signal path between the loopback circuit and the PA. An example is apparatus 700 shown in FIG. 7.

In some implementations, the apparatus may further include a second combining element external to the FEM. The loopback circuit may be external to the FEM. The combining element may be coupled between the PA, the LNA and the antenna to provide the PA output signal from the PA to the antenna and to provide the pre-amplified incoming signal from the antenna to the LNA. The second combining element, which may be a T/R switch for example, may be coupled between the LNA, the loopback circuit and the transceiver to provide the incoming signal from the LNA to the transceiver and to provide the loopback signal from the loopback circuit to the transceiver. The FEM may include a plurality of communication ports or pins such as the following: a first port configured to facilitate a signal path between the antenna and the combining element, a second port configured to facilitate a signal path between the PA and the transceiver, and a third port configured to facilitate a signal path between the LNA and the second combining element. The loopback circuit may be coupled to receive the PA output signal from a node on the signal path between the antenna and the combining element. An example is apparatus 800 shown in FIG. 8.

In some implementations, the loopback circuit may be an integral part of the FEM. The combining element may include a first combining element and a second combining element, each of which may be a T/R switch for example. The first combining element may be coupled between the PA, the LNA and the antenna to provide the PA output signal from the PA to the antenna and to provide the pre-amplified incoming signal from the antenna to the LNA. The second combining element may be coupled between the LNA, the loopback circuit and the transceiver to provide the incoming signal from the LNA to the transceiver and to provide the loopback signal from the loopback circuit to the transceiver. The loopback circuit may be coupled to receive the PA output signal from an output of the PA. The FEM may include a plurality of communication ports or pins such as the following: a first port configured to facilitate a signal path between the antenna and the first combining element, a second port configured to facilitate a signal path between the PA and the transceiver, and a third port configured to facilitate a signal path between the second combining element and the transceiver. An example is apparatus 900 shown in FIG. 9.

In some implementations, the apparatus may further include a signal sensing circuit and a down converter coupled between an output of the PA and an input of the loopback circuit. The loopback circuit may be an integral part of the FEM. The loopback circuit may be coupled to receive the PA output signal through the signal sensing circuit and the down converter. The combining element may include a first combining element and a second combining element, each of which may be a T/R switch for example. The first combining element may be coupled between the PA, the LNA and the antenna to provide the PA output signal from the PA to the antenna and to provide the pre-amplified incoming signal from the antenna to the LNA. The second combining element may be coupled between the LNA, the loopback circuit and the transceiver to provide the incoming signal from the LNA to the transceiver and to provide the loopback signal from the loopback circuit to the transceiver. The FEM may include a plurality of communication ports or pins such as the following: a first port configured to facilitate a signal path between the antenna and the first combining element, a second port configured to facilitate a signal path between the PA and the transceiver, and a third port configured to facilitate a signal path between the second combining element and the transceiver. An example is apparatus 1000 shown in FIG. 10.

In some implementations, the loopback circuit may be an integral part of the FEM. The combining element may include a first combining element and a second combining element, each of which may be a T/R switch for example. The second combining element may be coupled between the LNA, the loopback circuit and the transceiver to provide the incoming signal from the LNA to the transceiver and to provide the loopback signal from the loopback circuit to the transceiver. The FEM may include a first die and a second die. The first die may include the first combining element. The second die may include the PA, the LNA, the loopback circuit and the second combining element. The FEM may also include a first bond wire and a second bond wire. The first bond wire may electrically connect the first combining element and an output of the PA to provide the PA output signal from the PA to the antenna. The second bond wire may electrically connect the first combining element and a node which is connected to an input of the LNA and an input of the loopback circuit to provide the pre-amplified incoming signal from the antenna to the LNA and to provide the PA output signal from the PA to the loopback circuit. The FEM may include a plurality of communication ports or pins such as the following: a first port configured to facilitate a signal path between the antenna and the first combining element, a second port configured to facilitate a signal path between the PA and the transceiver, and a third port configured to facilitate a signal path between the second combining element and the transceiver. An example is apparatus 1100 shown in FIG. 11.

In some implementations, the loopback circuit may be an integral part of the FEM. The combining element may include a first combining element and a second combining element, each of which may be a T/R switch for example. The second combining element may be coupled between the LNA, the loopback circuit and the transceiver to provide the incoming signal from the LNA to the transceiver and to provide the loopback signal from the loopback circuit to the transceiver. The FEM may include a first die and a second die. The first die may include the first combining element. The second die may include the PA, the LNA, the loopback circuit and the second combining element. The FEM may also include a first bond wire, a second bond wire and a third bond wire. The first bond wire may electrically connect the first combining element and an output of the PA to provide the PA output signal from the PA to the antenna. The second bond wire may electrically connect the first combining element and the LNA to provide the pre-amplified incoming signal from the antenna to the LNA. The third bond wire may electrically connect the first combining element and the loopback circuit to provide the PA output signal from the PA to the loopback circuit. The FEM may include a plurality of communication ports or pins such as the following: a first port configured to facilitate a signal path between the antenna and the first combining element, a second port configured to facilitate a signal path between the PA and the transceiver, and a third port configured to facilitate a signal path between the second combining element and the transceiver. An example is apparatus 1200 shown in FIG. 12.

In still another aspect, an apparatus may include an antenna, a transceiver configured to generate an outgoing signal and receive an incoming signal, a PA, a LNA, and a loopback path. The PA may be configured to receive the outgoing signal from the transceiver as a PA input signal and amplify the PA input signal to provide a PA output signal to the antenna. The LNA may be configured to receive a pre-amplified incoming signal from the antenna and amplify the pre-amplified incoming signal to provide the incoming signal to the transceiver. The loopback path may be coupled in parallel with the LNA, and may be configured to sense the PA output signal and generate a loopback signal corresponding to characteristics of the PA output signal. The loopback path may be further configured to operate at a first frequency different from a second frequency of the outgoing signal. The loopback signal may be received by the transceiver. An example is apparatus 1300 shown in FIG. 13.

In some implementations, an output of the LNA and an output of the loopback path may be electrically connected to an output pin which is electrically connected to the transceiver.

In some implementations, the apparatus may further include a switch coupled between the output of the LNA and the output pin. The switch may be configured to connect the LNA to the output pin when the loopback path is deactivated. The switch may be further configured to disconnect the LNA from the output pin when the loopback path is activated.

In some implementations, the loopback path may include an attenuator, a frequency translator, and a buffer. The attenuator may be configured to receive and attenuate the PA output signal to output an attenuated signal. The frequency translator may be configured to receive the attenuated signal and generate a frequency-translated signal having the first frequency. The buffer may be configured to receive the frequency-translated signal and provide the loopback signal.

In some implementations, the frequency translator may include a squaring circuit.

In some implementations, the PA, the LNA and the loopback path are integral parts of a front-end module (FEM).

ADDITIONAL NOTES

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A closed-loop digital pre-distortion (DPD) circuit, comprising:
    a loopback path coupled to receive a power amplifier (PA) output signal to output a loopback signal, wherein the PA output signal is provided by a PA receiving and amplifying a PA input signal, wherein a forward coupling and a backward coupling exist between the PA input signal and an output of the loopback path, wherein the loopback path comprises a coupling cancellation mechanism configured to cancel at least a portion of couplings between the PA input signal and the loopback signal,
    wherein the coupling cancellation mechanism comprises:
        an attenuator configured to receive and attenuate the PA output signal to output an attenuated signal; and
        a phase alternator configured to receive the attenuated signal and shift a phase of the attenuated signal to output a first loopback signal and a second loopback signal with a non-zero phase shift from the first loopback signal such that a difference between the first loopback signal and the second loopback signal is at least approximately linearly proportional to a product of a gain of the PA and a gain of the loopback path.

2. The closed-loop DPD circuit of claim 1, wherein the loopback path and the PA are included in a front-end module (FEM) implemented by a single integrated-circuit (IC) chip disposed outside of a transceiver that generates the PA input signal.

3. A closed-loop digital pre-distortion (DPD) circuit, comprising:
    a loopback path coupled to receive a PA output signal, wherein the PA output signal is provided by a power amplifier (PA) receiving and amplifying a PA input signal, and wherein a forward coupling and a backward coupling exist between the PA input signal and an output of the loopback path; and
    a phase shifting circuit configured to shift a phase of either the PA input signal or the PA output signal to cause the loopback path to output a first loopback signal and a second loopback signal with a non-zero phase shift from the first loopback signal such that a difference between the first loopback signal and the second loopback signal is at least approximately linearly proportional to a product of a gain of the PA and a gain of the loopback path.

4. The closed-loop DPD circuit of claim 3, wherein the first loopback signal and the second loopback signal differ from each other by a phase shift of 180°.

5. The closed-loop DPD circuit of claim 3, wherein the loopback path comprises:
    a first attenuator configured to receive and attenuate the PA output signal to output a first attenuated signal;
    a phase alternator functioning as the phase shifting circuit and coupled to receive the first attenuated signal, the phase alternator configured to shift a phase of the first attenuated signal to output a phase alternator output signal;
    a second attenuator configured to receive and attenuate the phase alternator output signal to output a second attenuated signal; and
    a down converter configured to receive and down convert the second attenuated signal from a first frequency to a second frequency lower than the first frequency.

6. The closed-loop DPD circuit of claim 3, further comprising:
    a DPD calibration engine configured to output a pre-distorted signal;
    a digital-to-analog converter (DAC) coupled to receive the pre-distorted signal and configured to convert the pre-distorted signal to output an analog signal;

a transmitter coupled to receive the analog signal and configured to output the PA input signal based on the analog signal;
an analog-to-digital converter (ADC) coupled to receive an output of the loopback path and configured to convert the output of the loopback path to a digital signal,
wherein the DPD calibration engine is coupled to receive the digital signal and configured to generate the pre-distorted signal based at least in part on the digital signal.

7. The closed-loop DPD circuit of claim 6, further comprising:
a coupling compensation filter coupled between the DPD calibration engine and the loopback path and configured to filter an output of the loopback path, the coupling compensation filter having a filtering coefficient that is set based on a coupling effect caused by the forward coupling and the backward coupling.

8. A method implementable in a closed-loop digital pre-distortion (DPD) circuit, comprising:
phase shifting a phase of either a power amplifier (PA) output signal or a PA input signal of the closed-loop DPD circuit to cause a loopback path of the closed-loop DPD circuit to output a first loopback signal and a second loopback signal with a non-zero phase shift from the first loopback signal; and
performing, by a calibration engine, a computation to process the first loopback signal and the second loopback signal to obtain a product of a gain of a PA and a gain of the loopback path to replicate the PA output signal and to determine coupling effects caused by a forward coupling and a backward coupling that exist between the PA input signal and the output of the loopback path,
wherein the PA is configured to receive the PA input signal and amplify the PA input signal to provide the PA output signal.

9. The method of claim 8, wherein the first loopback signal and the second loopback signal differ from each other by a phase shift of 180°.

10. The method of claim 8, further comprising:
processing the first loopback signal and the second loopback signal to determine a coupling effect caused by the forward coupling and the backward coupling.

11. The method of claim 10, further comprising:
calibrating a DPD calibration engine of the closed-loop DPD circuit using a signal derived from the PA output signal based at least in part on the coupling effect in a real-time manner or in an adaptive manner.

12. The method of claim 11, wherein the calibrating in the real-time manner comprises keeping the loopback path enabled to perform DPD calibration.

13. The method of claim 11, wherein the calibrating in the adaptive manner comprises enabling the loopback path as needed to perform DPD calibration.

14. The method of claim 10, further comprising:
filtering an output of the loopback path with a coupling compensation filter having a filtering coefficient that is set based on the coupling effect; and performing DPD processing using the filtered signal.

15. An apparatus, comprising:
a front-end module (FEM) implemented by a single integrated-circuit (IC) chip disposed outside of an antenna and a transceiver, the FEM comprising:
a first combining element coupled to the antenna to transmit and receive signals through the antenna;
a power amplifier (PA) configured to receive an outgoing signal from the transceiver as a PA input signal and amplify the PA input signal to provide a PA output signal to the antenna through the first combining element; and
a low-noise amplifier (LNA) configured to receive a pre-amplified incoming signal from the antenna through the first combining element, the LNA further configured to amplify the pre-amplified incoming signal to provide an incoming signal to the transceiver; and
a loopback circuit configured to sense the PA output signal and generate a loopback signal corresponding to characteristics of the PA output signal,
wherein the loopback circuit comprises a coupling cancellation mechanism configured to cancel at least a portion of couplings between the PA input signal and the loopback signal,
wherein the coupling cancellation mechanism comprises:
an attenuator configured to receive and attenuate the PA output signal to output an attenuated signal; and
a phase alternator configured to output a first loopback signal and a second loopback signal with a non-zero phase shift from the first loopback signal such that a difference between the first loopback signal and the second loopback signal is at least approximately proportional to a product of a gain of the PA and a gain of the loopback circuit.

16. The apparatus of claim 15, wherein the loopback circuit is further configured to perform signal down-conversion.

17. The apparatus of claim 15, wherein the loopback circuit is coupled to receive the PA output signal through the first combining element, either from a node on the signal path between the PA and the first combining element or from a node on the signal path between the antenna and the first combining element.

18. The apparatus of claim 15, further comprising a second combining element, wherein the loopback signal is received by the transceiver through the second combining element.

19. The apparatus of claim 15, wherein the loopback circuit is an integral part of the FEM, and wherein the FEM comprises a plurality of communication ports or pins comprising:
a first port configured to facilitate a signal path between the antenna and the first combining element;
a second port configured to facilitate a signal path between the PA and the transceiver; and
a third port configured to facilitate a signal path between the LNA and the transceiver.

20. The apparatus of claim 15, wherein the loopback circuit is external to the FEM, and wherein the FEM comprises a plurality of communication ports or pins comprising:
a first port configured to facilitate a signal path between the antenna and the first combining element;
a second port configured to facilitate a signal path between the PA and the transceiver; and
a third port configured to facilitate a signal path between the LNA and the transceiver.

21. The apparatus of claim 15, further comprising a signal sensing circuit and a down converter coupled between an output of the PA and an input of the loopback circuit, wherein the loopback circuit is coupled to receive the PA output signal through the signal sensing circuit and the down converter.

22. The apparatus of claim 15, wherein the FEM comprises a first die and a second die, wherein the first die comprises the first combining element, wherein the second die comprises at least one of the PA, the LNA, and the loopback circuit, wherein the FEM further comprises a first bond wire electrically connecting the first combining element and an output of the PA to provide the PA output signal from the PA to the antenna, wherein the FEM further comprises a second bond wire electrically connecting the first combining element and an input of the loopback circuit to provide the PA output signal from the PA to the loopback circuit.

23. The apparatus of claim 15, wherein the loopback circuit is either inside the FEM with the loopback signal received by the transceiver or outside the FEM with the loopback signal and the pre-amplified incoming signal sharing with the LNA a same port to the transceiver.

\* \* \* \* \*